US012787819B2

(12) United States Patent
We et al.

(10) Patent No.: US 12,787,819 B2
(45) Date of Patent: Nov. 3, 2026

(54) PACKAGE SUBSTRATE COMPRISING EMBEDDED INTEGRATED DEVICE

(71) Applicant: QUALCOMM Incorporated, San Diego, CA (US)

(72) Inventors: Hong Bok We, San Diego, CA (US); Joan Rey Villarba Buot, Escondido, CA (US); Sang-Jae Lee, San Diego, CA (US); Zhijie Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 537 days.

(21) Appl. No.: 18/190,019

(22) Filed: Mar. 24, 2023

(65) Prior Publication Data

US 2024/0321752 A1 Sep. 26, 2024

(51) Int. Cl.
*H10W 70/65* (2026.01)
*H10W 70/05* (2026.01)
(Continued)

(52) U.S. Cl.
CPC .......... *H10W 70/65* (2026.01); *H10W 70/05* (2026.01); *H10W 70/095* (2026.01);
(Continued)

(58) Field of Classification Search
CPC ............ H01L 23/5381; H01L 21/4857; H01L 21/486; H01L 23/13; H01L 23/49822; H01L 23/5383; H01L 23/5386; H01L 24/16; H01L 24/73; H01L 25/105; H01L 25/165; H01L 2224/16145; H01L 2224/16227; H01L 2224/32145; H01L 2224/32225; H01L 2224/73204; H01L 2225/1023; H01L 2225/1035; H01L 2225/1058; H01L 2924/15153; H01L 2924/15174; H10W 70/65; H10W 70/05; H10W 70/095; H10W 70/611; H10W 70/68; H10W 70/685; H10W 90/00; H10W 70/60; H10W 70/655; H10W 70/682;
(Continued)

(56) References Cited

U.S. PATENT DOCUMENTS

2014/0145300 A1 5/2014 Bhagavat et al.
2016/0329284 A1* 11/2016 We .......................... H10P 72/74
(Continued)

FOREIGN PATENT DOCUMENTS

EP 3751607 A1 12/2020
WO 2016179159 A1 11/2016

OTHER PUBLICATIONS

International Search Report and Written Opinion—PCT/US2024/018533—ISA/EPO—Jul. 2, 2024.

*Primary Examiner* — Benjamin Tzu-Hung Liu
(74) *Attorney, Agent, or Firm* — Loza & Loza, LLP

(57) ABSTRACT

A package comprising a substrate and a second integrated device. The substrate includes at least one dielectric layer, a plurality of interconnects comprising a first plurality of interconnects, and a first integrated device located at least partially in the substrate. The first integrated device is coupled to the first plurality of interconnects through a first plurality of solder interconnects. The second integrated device is coupled to the first plurality of interconnects through a second plurality of solder interconnects.

24 Claims, 18 Drawing Sheets

CROSS SECTIONAL PROFILE VIEW

(51) Int. Cl.

| | |
|---|---|
| ***H10W 70/60*** | (2026.01) |
| ***H10W 70/655*** | (2026.01) |
| ***H10W 70/68*** | (2026.01) |
| ***H10W 70/685*** | (2026.01) |
| ***H10W 74/15*** | (2026.01) |
| ***H10W 90/00*** | (2026.01) |

(52) U.S. Cl.
CPC .......... *H10W 70/611* (2026.01); *H10W 70/68* (2026.01); *H10W 70/685* (2026.01); *H10W 90/00* (2026.01); *H10W 70/60* (2026.01); *H10W 70/655* (2026.01); *H10W 70/682* (2026.01); *H10W 74/15* (2026.01); *H10W 90/722* (2026.01); *H10W 90/724* (2026.01); *H10W 90/732* (2026.01); *H10W 90/734* (2026.01)

(58) Field of Classification Search
CPC . H10W 74/15; H10W 90/722; H10W 90/724; H10W 90/732; H10W 90/734
See application file for complete search history.

(56) References Cited

U.S. PATENT DOCUMENTS

| | | | | |
|---|---|---|---|---|
| 2020/0058627 | A1 | 2/2020 | Chen et al. | |
| 2021/0091005 | A1* | 3/2021 | Tsai | H10P 72/74 |
| 2022/0310518 | A1 | 9/2022 | Chen et al. | |
| 2023/0065615 | A1* | 3/2023 | Kung | H10W 20/20 |
| 2023/0163098 | A1* | 5/2023 | Elsherbini | H10W 80/00<br>257/532 |
| 2024/0063148 | A1* | 2/2024 | Foo | H10W 44/601 |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

PACKAGE SUBSTRATE COMPRISING EMBEDDED INTEGRATED DEVICE

FIELD

Various features relate to a package that includes a substrate.

BACKGROUND

A package may include a substrate and integrated devices. These components are coupled together to provide a package that may perform various functions. The performance of a package and its components may depend on many factors. There is an ongoing need to provide packages that provide improved performances. Moreover, there is an ongoing need to include a package that includes a more compact form factor so that the package may be implemented in smaller devices.

SUMMARY

Various features relate to a package that includes a substrate.

One example provides a package that includes a substrate and a second integrated device. The substrate includes at least one dielectric layer, a plurality of interconnects comprising a first plurality of interconnects, and a first integrated device located at least partially in the substrate. The first integrated device is coupled to the first plurality of interconnects through a first plurality of solder interconnects. The second integrated device is coupled to the first plurality of interconnects through a second plurality of solder interconnects.

Another example provides a device that includes a substrate and a second integrated device. The substrate includes at least one dielectric layer, a plurality of interconnects comprising a first plurality of interconnects, and a first integrated device located at least partially in the substrate. The first integrated device is coupled to the first plurality of interconnects through a first plurality of solder interconnects. The second integrated device is coupled to the first plurality of interconnects through a second plurality of solder interconnects.

Another example provides a method to fabricate a substrate, where fabricating the substrate comprises coupling a first integrated device to a first plurality of interconnects of a carrier, through a first plurality of solder interconnects; forming a first dielectric layer over the carrier and the first integrated device, wherein the first dielectric layer encapsulates the first integrated device, the first plurality of solder interconnects and the first plurality of interconnects; forming a second dielectric layer over a surface of the first dielectric layer; forming a first plurality of cavities in the second dielectric layer and the first dielectric layer; forming a second plurality of interconnects in at least the first plurality of cavities; forming a third dielectric layer over the second dielectric layer; forming a second plurality of cavities in the third dielectric layer; and forming a third plurality of interconnects in at least the second plurality of cavities.

Another example provides a method to fabricates a substrate, where fabricating the substrate comprises coupling a first integrated device to a first plurality of interconnects of a carrier, through a first plurality of solder interconnects; forming a first underfill between the first integrated device and the carrier, wherein the first underfill laterally surrounds the first plurality of solder interconnects; forming a first dielectric layer over the carrier; forming a second dielectric layer over the first integrated device and a surface of the first dielectric layer; forming a first plurality of cavities in the second dielectric layer and the first dielectric layer; forming a second plurality of interconnects in at least the first plurality of cavities; forming a third dielectric layer over the second dielectric layer; forming a second plurality of cavities in the third dielectric layer; and forming a third plurality of interconnects in at least the second plurality of cavities.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate and a second integrated device. The substrate includes at least one dielectric layer, a plurality of interconnects comprising a first plurality of interconnects, and a first integrated device located at least partially in the substrate. The first integrated device is coupled to the first plurality of interconnects through a first plurality of solder interconnects. The second integrated device is coupled to the first plurality of interconnects through a second plurality of solder interconnects. Embedding the integrated device in the substrate allows the integrated device to be close to the second integrated device, which reduces the distance that an electrical signal has to travel between the integrated device and the second integrated device. Thus, placing the integrated device near the second integrated device, and vice versa, can help improve the performance of the second integrated device and the package.

Exemplary Package Comprising a Substrate With an Embedded Integrated Device

Figure 1:
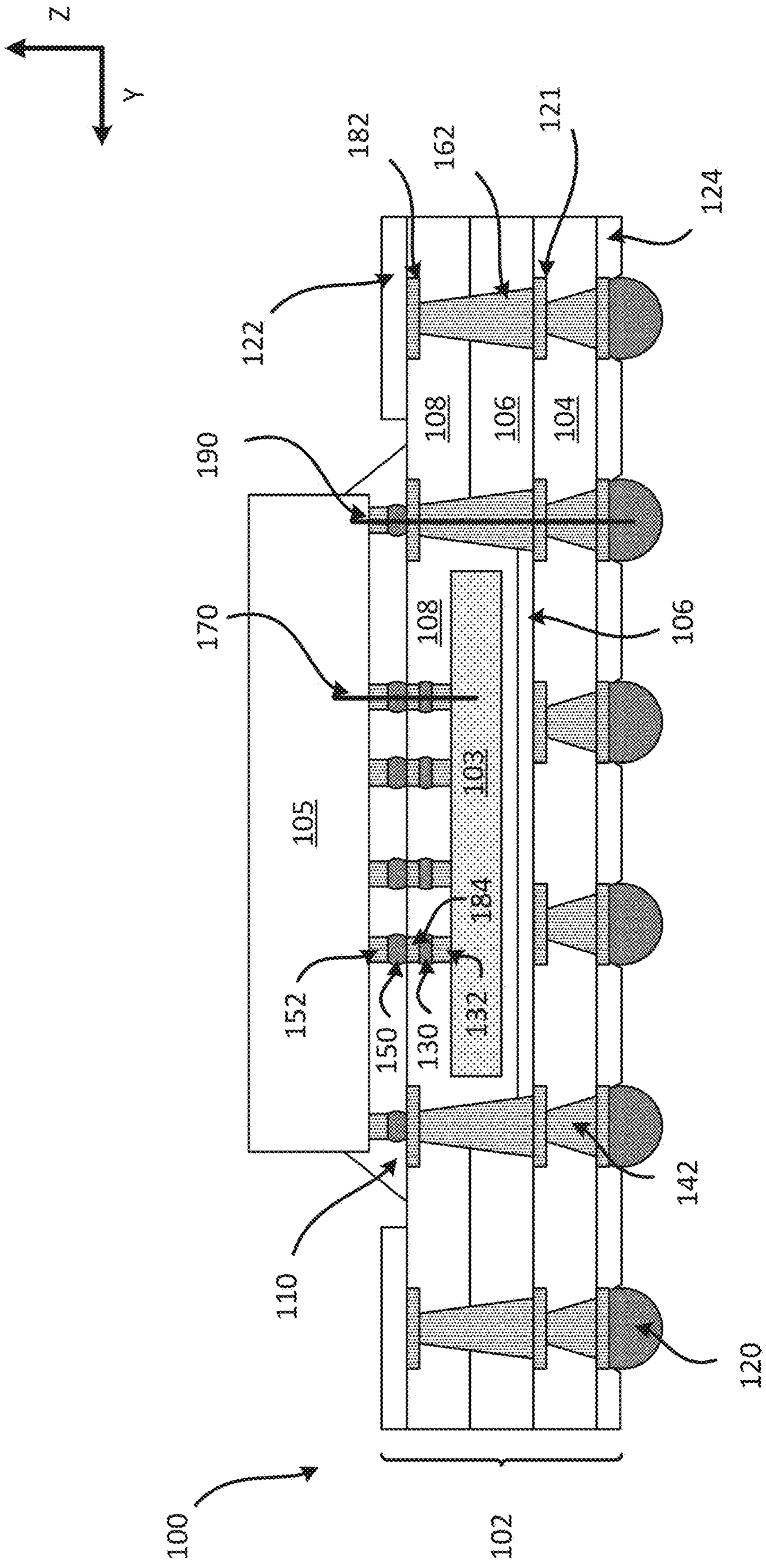
FIG. 1 illustrates a cross sectional profile view of an exemplary package that includes a substrate with an embedded integrated device.

FIG. 1 illustrates a package 100 that includes a substrate with an embedded integrated device. The package 100 includes a substrate 102, an integrated device 103 and an integrated device 105. In some implementations, the integrated device 103 may be configured as a deep trench capacitor device. In some implementations, the integrated device 103 may be configured as a bridge. In some implementations, the integrated device 103 may be replaced by a bridge that includes a plurality of bridge interconnects.

The substrate 102 may be a package substrate. The substrate 102 includes a dielectric layer 104, a dielectric layer 106, a dielectric layer 108, a plurality of interconnects 121, a solder resist layer 122, a solder resist layer 124 and a plurality of solder interconnects 120. The plurality of interconnects 121 may include a plurality of interconnects 142, a plurality of interconnects 162 and a plurality of interconnects 182. The dielectric layer 104, the dielectric layer 106 and/or the dielectric layer 108 may include the same material or different materials. For example, the dielectric layer 104, the dielectric layer 106 and/or the dielectric layer 108 may include prepreg, Ajinomoto Build-Up Film (ABF) and/or an underfill. In one example, the dielectric layer 108 may include ABF (or no glass reinforced resin), the dielectric layer 106 may include ABF or prepreg, and the dielectric layer 104 may include prepreg.

The dielectric layer 106 is located between the dielectric layer 108 and the dielectric layer 104. The dielectric layer 104 is coupled to the dielectric layer 106. The dielectric layer 108 is coupled to the dielectric layer 106. The plurality of interconnects 142 may be located at least in the dielectric layer 104. The plurality of interconnects 162 may be located at least in the dielectric layer 106 and the dielectric layer 108. In some implementations, the plurality of interconnects 162 may extend through at least part of the dielectric layer 106 and at least part of the dielectric layer 108. For example, the plurality of interconnects 162 may include vias (e.g., via interconnects) that extend through at least part of the dielectric layer 106 and at least part of the dielectric layer 108. The plurality of interconnects 182 may be located at least in the dielectric layer 108. The plurality of interconnects 182 are coupled to the plurality of interconnects 162. The plurality of interconnects 162 are coupled to the plurality of interconnects 142. The plurality of solder interconnects 120 are coupled to the substrate 102. For example, the plurality of solder interconnects 120 are coupled to the plurality of interconnects 142. The solder resist layer 122 may be coupled to the dielectric layer 108. The solder resist layer 124 may be coupled to the dielectric layer 104.

The integrated device 103 is located at least partially inside of the substrate 102. The integrated device 103 is surrounded by the dielectric layer 108. The dielectric layer 108 may touch a front side of the integrated device 103, a back side of the integrated device and/or a side surface of the integrated device 103. The integrated device 103 may include a plurality of pillar interconnects 132. A plurality of solder interconnects 130 may be coupled to the plurality of pillar interconnects 132. A plurality of interconnects 184 may be coupled to the plurality of solder interconnects 130. The plurality of interconnects 184 may considered part of the plurality of interconnects 182 and/or the plurality of interconnects 121. The plurality of pillar interconnects 132, the plurality of solder interconnects 130 and the plurality of interconnects 184 may be located in the dielectric layer 108. Thus, the integrated device 103, the plurality of pillar interconnects 132, the plurality of solder interconnects 130 and the plurality of interconnects 184 may be embedded in the substrate 102.

The integrated device 105 is coupled to the substrate 102 through a plurality of solder interconnects 150. The integrated device 105 may include a plurality of pillar interconnects 152. The plurality of solder interconnects 150 may be coupled to the plurality of pillar interconnects 152 and the plurality of interconnects 184. The plurality of solder interconnects 150 may be located between the plurality of pillar interconnects 152 and the plurality of interconnects 184. The plurality of solder interconnects 130 may be located between the plurality of pillar interconnects 132 and the plurality of interconnects 184. An underfill 110 may be located between the integrated device 105 and the substrate 102. The underfill 110 may laterally surround the plurality of pillar interconnects 152 and the plurality of solder interconnects 150.

A front side of the integrated device 105 may face the substrate 102. The front side of the integrated device 105 may face towards the integrated device 103. A front side of the integrated device 103 may face towards the integrated device 105.

In some implementations, an electrical path 170 between the integrated device 105 and the integrated device 103 may include at least one pillar interconnect from the plurality of pillar interconnects 152, at least one solder interconnect from plurality of solder interconnects 150, at least one interconnect from the plurality of interconnects 184, at least one solder interconnect from the plurality of solder interconnects 130 and at least one pillar interconnect from the plurality of pillar interconnects 132. The electrical path 170 may be configured to provide an electrical path for power. The electrical path 170 may be configured to provide an electrical path for signals.

The package 100 may be coupled to a board (not shown), such as a printed circuit board, through the plurality of solder interconnects 120. In some implementations, an electrical path 190 between the integrated device 105 and a board (not shown) may include at least one pillar interconnect from the plurality of pillar interconnects 152, at least one solder interconnect from plurality of solder interconnects 150, at least one interconnect from the plurality of interconnects 182, at least one interconnect from the plurality of interconnects 162, at least one interconnect from the plurality of interconnects 142 and at least one solder interconnect from the plurality of solder interconnects 120. The electrical path 190 may be configured to provide an electrical path for power. The electrical path 190 may be configured to provide an electrical path for signals.

The structure and/or configuration shown in FIG. 1, allows the integrated device 103 to be placed and/or located near the integrated device 105, shortening the distance that a current has to travel between the integrated device 103 and the integrated device 105, which can lead to an overall improvement in the performance of the integrated device 103, the integrated device 105 and/or the package 100.

Figure 2:
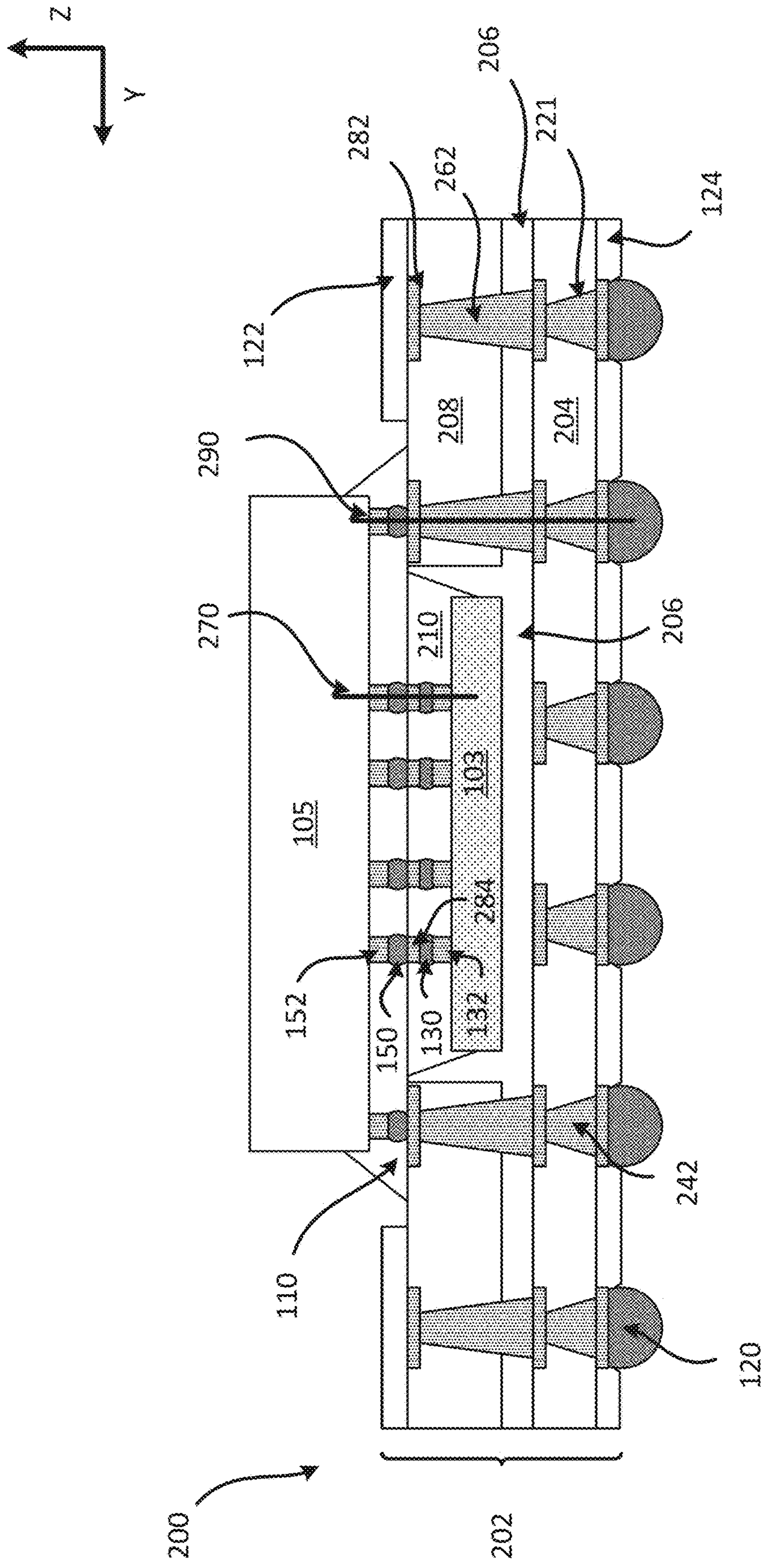
FIG. 2 illustrates a cross sectional profile view of an exemplary package that includes a substrate with an embedded integrated device.

FIG. 2 illustrates a package 200 that includes a substrate with an embedded integrated device. The package 200 includes a substrate 202, an integrated device 103 and an integrated device 105. In some implementations, the integrated device 103 may be configured as a deep trench capacitor device. In some implementations, the integrated device 103 may be configured as a bridge. In some implementations, the integrated device 103 may be replaced by a bridge that includes a plurality of bridge interconnects.

The substrate 202 may be a package substrate. The substrate 202 includes a dielectric layer 204, a dielectric layer 206, a dielectric layer 208, an underfill 210, a plurality of interconnects 221, a solder resist layer 122, a solder resist layer 124 and a plurality of solder interconnects 120. The plurality of interconnects 221 may include a plurality of interconnects 242, a plurality of interconnects 262 and a plurality of interconnects 282. The dielectric layer 204, the dielectric layer 206 and/or the dielectric layer 208 may include the same material or different materials. For example, the dielectric layer 204, the dielectric layer 206 and/or the dielectric layer 208 may include prepreg, Ajinomoto Build-Up Film (ABF) and/or an underfill. In one example, the dielectric layer 208 may include ABF or prepreg, the dielectric layer 206 may include ABF (or no glass reinforced resin) and the dielectric layer 204 may include prepreg.

The dielectric layer 206 is located between the dielectric layer 208 and the dielectric layer 204. The dielectric layer 204 is coupled to the dielectric layer 206. The dielectric layer 208 is coupled to the dielectric layer 206. The plurality of interconnects 242 may be located at least in the dielectric layer 204. The plurality of interconnects 262 may be located at least in the dielectric layer 206 and the dielectric layer 208. In some implementations, the plurality of interconnects 262 may extend through at least part of the dielectric layer 206 and at least part of the dielectric layer 208. For example, the plurality of interconnects 262 may include vias (e.g., via interconnects) that extend through at least part of the dielectric layer 206 and at least part of the dielectric layer 208. The plurality of interconnects 282 may be located at least in the dielectric layer 208. The plurality of interconnects 282 are coupled to the plurality of interconnects 262. The plurality of interconnects 262 are coupled to the plurality of interconnects 242. The plurality of solder interconnects 120 are coupled to the substrate 202. For example, the plurality of solder interconnects 120 are coupled to the plurality of interconnects 242. The solder resist layer 122 may be coupled to the dielectric layer 208. The solder resist layer 124 may be coupled to the dielectric layer 204.

The integrated device 103 is located at least partially inside of the substrate 202. The integrated device 103 is surrounded by the dielectric layer 206. The dielectric layer 206 may touch a back side of the integrated device and/or a side surface of the integrated device 103. The underfill 210 may touch a front side of the integrated device 103. The integrated device 103 may include a plurality of pillar interconnects 132. A plurality of solder interconnects 130 may be coupled to the plurality of pillar interconnects 132. A plurality of interconnects 284 may be coupled to the plurality of solder interconnects 130. The plurality of interconnects 284 may considered part of the plurality of interconnects 282 and/or the plurality of interconnects 121. The plurality of pillar interconnects 132, the plurality of solder interconnects 130 and the plurality of interconnects 284 may be located in the underfill 210. Thus, the integrated device 103, the plurality of pillar interconnects 132, the plurality of solder interconnects 130 and the plurality of interconnects 284 may be embedded in the substrate 202.

The integrated device 105 is coupled to the substrate 202 through a plurality of solder interconnects 150. The integrated device 105 may include a plurality of pillar interconnects 152. The plurality of solder interconnects 150 may be coupled to the plurality of pillar interconnects 152 and the plurality of interconnects 284. The plurality of solder interconnects 150 may be located between the plurality of pillar interconnects 152 and the plurality of interconnects 284. The plurality of solder interconnects 130 may be located between the plurality of pillar interconnects 132 and the plurality of interconnects 284. An underfill 110 may be located between the integrated device 105 and the substrate 202. The underfill 110 may laterally surround the plurality of pillar interconnects 152 and the plurality of solder interconnects 150. The under 110 may be coupled to and touch the underfill 210 of the substrate 202.

A front side of the integrated device 105 may face the substrate 202. The front side of the integrated device 105 may face towards the integrated device 103. A front side of the integrated device 103 may face towards the integrated device 105.

In some implementations, an electrical path 270 between the integrated device 105 and the integrated device 103 may include at least one pillar interconnect from the plurality of pillar interconnects 152, at least one solder interconnect from plurality of solder interconnects 150, at least one interconnect from the plurality of interconnects 284, at least one solder interconnect from the plurality of solder interconnects 130 and at least one pillar interconnect from the plurality of pillar interconnects 132. The electrical path 270 may be configured to provide an electrical path for power. The electrical path 270 may be configured to provide an electrical path for signals.

The package 200 may be coupled to a board (not shown), such as a printed circuit board, through the plurality of solder interconnects 120. In some implementations, an electrical path 290 between the integrated device 105 and a board (not shown) may include at least one pillar interconnect from the plurality of pillar interconnects 152, at least one solder interconnect from plurality of solder interconnects 150, at least one interconnect from the plurality of interconnects 282, at least one interconnect from the plurality of interconnects 262, at least one interconnect from the plurality of interconnects 242 and at least one solder interconnect from the plurality of solder interconnects 120. The electrical path 290 may be configured to provide an electrical path for power. The electrical path 290 may be configured to provide an electrical path for signals.

The structure and/or configuration shown in FIG. 2, allows the integrated device 103 to be placed and/or located near the integrated device 105, shortening the distance that a current has to travel between the integrated device 103 and the integrated device 105, which can lead to an overall improvement in the performance of the integrated device 103, the integrated device 105 and/or the package 100.

Figure 3:
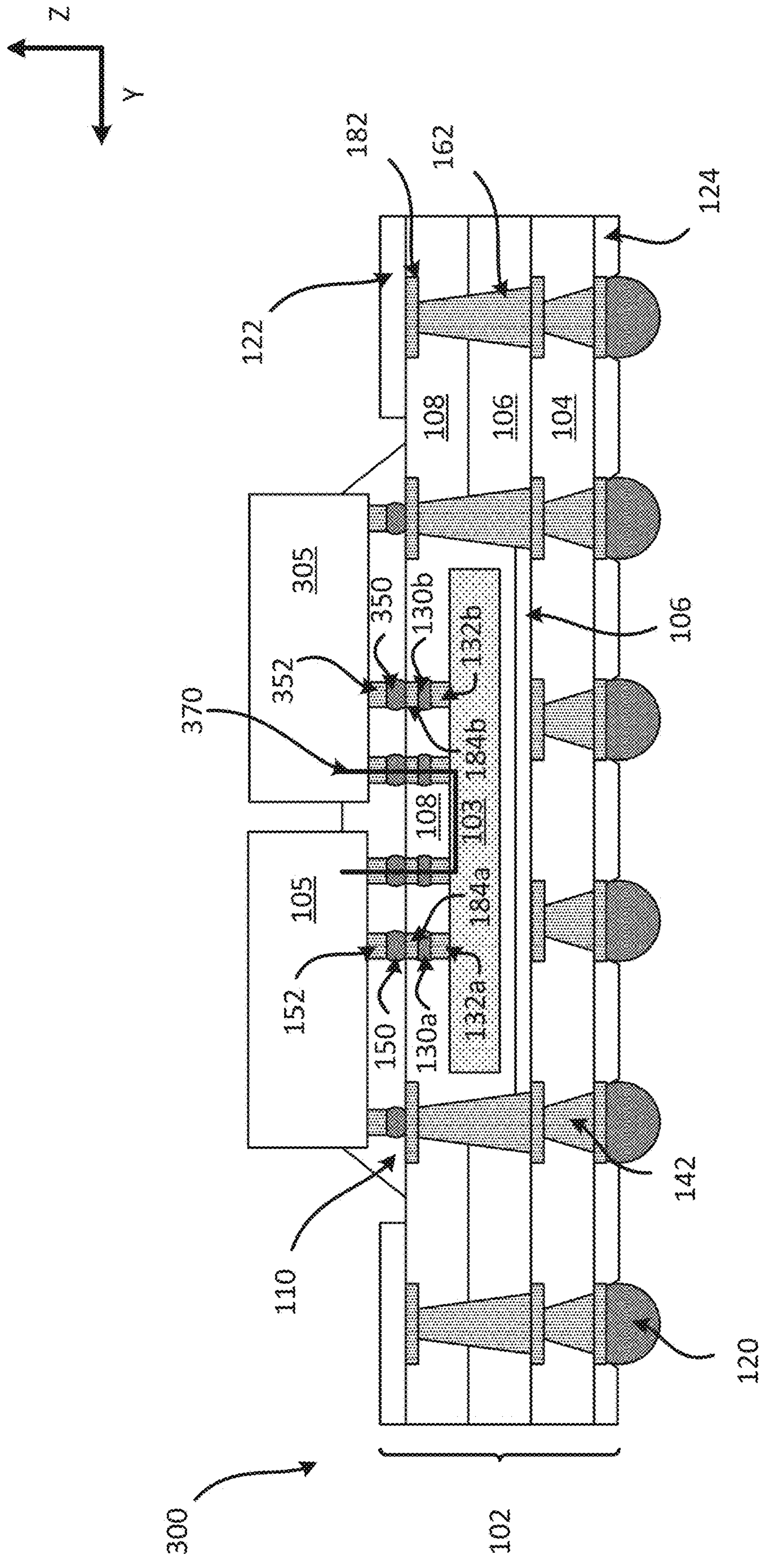
FIG. 3 illustrates a cross sectional profile view of an exemplary package that includes a substrate with an embedded integrated device.
Figure 4:
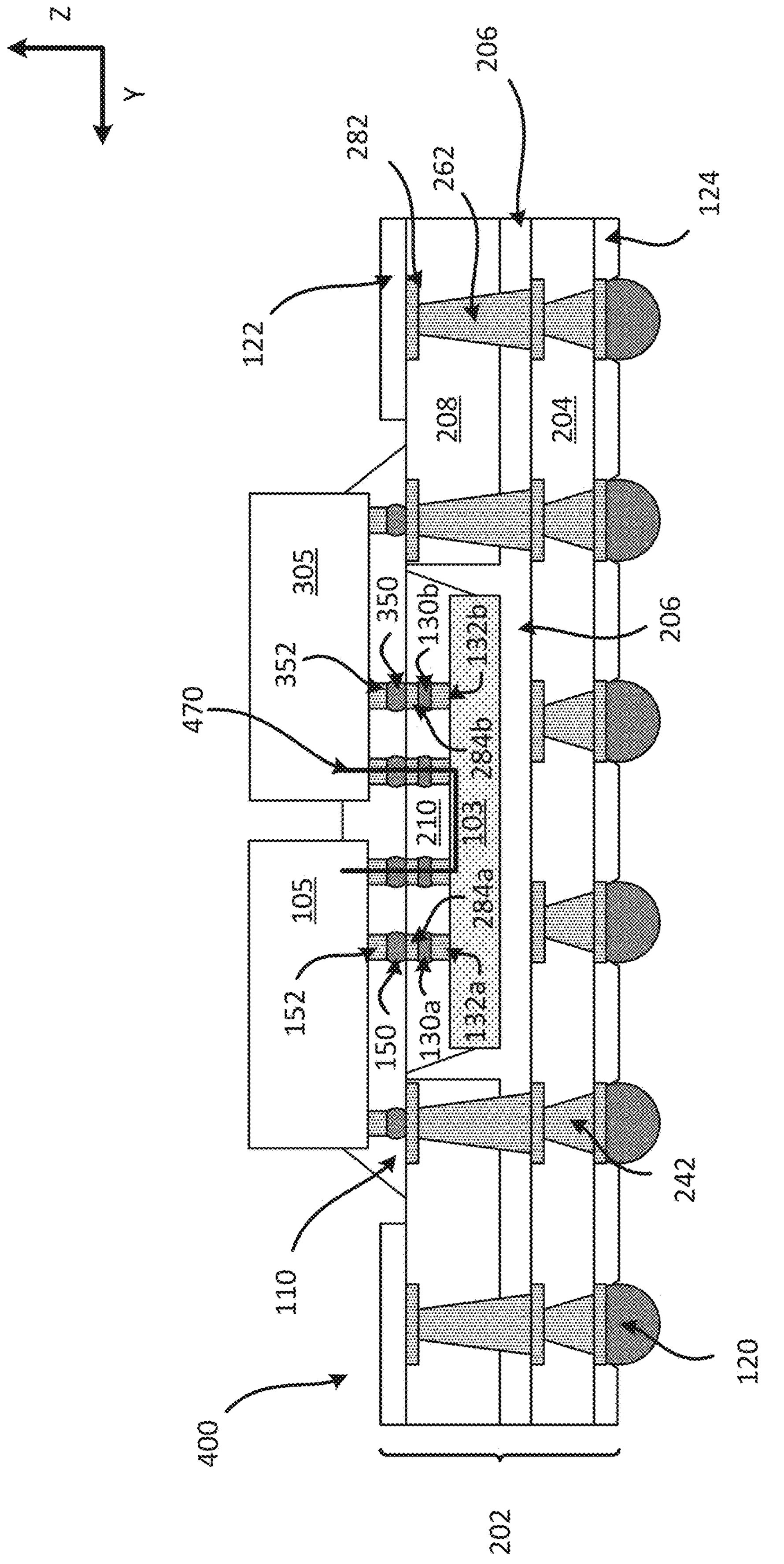
FIG. 4 illustrates a cross sectional profile view of an exemplary package that includes a substrate with an embedded integrated device.

In some implementations, more than one integrated device may be coupled to a substrate and/or more than one integrated device may be embedded in the substrate (e.g., 102, 202). FIGS. 3 and 4 illustrate examples of multiple integrated devices coupled to a substrate of a package.

FIG. 3 illustrates a package 300 that includes a substrate with an embedded integrated device. The package 300 includes a substrate 102, an integrated device 103, an integrated device 105 and an integrated device 305. In some implementations, the integrated device 103 may be configured as a deep trench capacitor device. In some implementations, the integrated device 103 may be configured as a bridge. In some implementations, the integrated device 103 may be replaced by a bridge that includes a plurality of bridge interconnects. The package 300 is similar to the package 100 of FIG. 1. However, the package 300 illustrates two integrated devices coupled to the substrate 102. The integrated device 105 is coupled to the substrate 102 and the integrated device 305 is coupled to the substrate 102. The plurality of interconnects 184 includes a plurality of interconnects 184*a* and a plurality of interconnects 184*b*. The plurality of pillar interconnects 132 includes a plurality of pillar interconnects 132*a* and a plurality of pillar interconnects 132*b*. The plurality of solder interconnects 130 includes a plurality of solder interconnects 130*a* and a plurality of solder interconnects 130*b*.

The integrated device 105 is coupled to the substrate 102 through a plurality of solder interconnects 150. The integrated device 105 may include a plurality of pillar interconnects 152. The plurality of solder interconnects 150 may be coupled to the plurality of pillar interconnects 152 and the plurality of interconnects 184*a*. The plurality of solder interconnects 150 may be located between the plurality of pillar interconnects 152 and the plurality of interconnects 184*a*. The plurality of solder interconnects 130*a* may be located between the plurality of pillar interconnects 132*a* and the plurality of interconnects 184*a*. An underfill 110 may be located between the integrated device 105 and the substrate 102. The underfill 110 may laterally surround the plurality of pillar interconnects 152 and the plurality of solder interconnects 150.

A front side of the integrated device 105 may face the substrate 102. The front side of the integrated device 105 may face towards the integrated device 103. A front side of the integrated device 103 may face towards the integrated device 105.

The integrated device 305 is coupled to the substrate 102 through a plurality of solder interconnects 350. The integrated device 305 may include a plurality of pillar interconnects 352. The plurality of solder interconnects 350 may be coupled to the plurality of pillar interconnects 352 and the plurality of interconnects 184*b*. The plurality of solder interconnects 350 may be located between the plurality of pillar interconnects 352 and the plurality of interconnects 184*b*. The plurality of solder interconnects 130*b* may be located between the plurality of pillar interconnects 132*b* and the plurality of interconnects 184*b*. An underfill 110 may be located between the integrated device 305 and the substrate 102. The underfill 110 may laterally surround the plurality of pillar interconnects 352 and the plurality of solder interconnects 350.

A front side of the integrated device 305 may face the substrate 102. The front side of the integrated device 305 may face towards the integrated device 103. A front side of the integrated device 103 may face towards the integrated device 305.

In some implementations, an electrical path between the integrated device 105 and the integrated device 103 may include at least one pillar interconnect from the plurality of pillar interconnects 152, at least one solder interconnect from plurality of solder interconnects 150, at least one interconnect from the plurality of interconnects 184*a*, at least one solder interconnect from the plurality of solder interconnects 130*a* and at least one pillar interconnect from the plurality of pillar interconnects 132*a*.

In some implementations, an electrical path between the integrated device 305 and the integrated device 103 may include at least one pillar interconnect from the plurality of pillar interconnects 352, at least one solder interconnect from plurality of solder interconnects 350, at least one interconnect from the plurality of interconnects 184*b*, at least one solder interconnect from the plurality of solder interconnects 130*b* and at least one pillar interconnect from the plurality of pillar interconnects 132*b*.

In some implementations, an electrical path 370 between the integrated device 305 and the integrated device 105 may include at least one pillar interconnect from the plurality of pillar interconnects 352, at least one solder interconnect from plurality of solder interconnects 350, at least one interconnect from the plurality of interconnects 184*b*, at least one solder interconnect from the plurality of solder interconnects 130*b*, at least one pillar interconnect from the plurality of pillar interconnects 132*b*, the integrated device 103, at least one pillar interconnect from the plurality of pillar interconnects 132*a*, at least one solder interconnect from the plurality of solder interconnects 130*a*, at least one interconnect from the plurality of interconnects 184*a*, at least one solder interconnect from plurality of solder interconnects 150, and at least one pillar interconnect from the plurality of pillar interconnects 152. The electrical path 370 may be configured to provide an electrical path for signals (e.g., input/output signals) between the integrated device 305 and the integrated device 105.

In some implementations, an electrical path between the integrated device 305 and the integrated device 105 may include at least one pillar interconnect from the plurality of pillar interconnects 352, at least one solder interconnect from plurality of solder interconnects 350, at least one interconnect from the plurality of interconnects 184, at least one solder interconnect from plurality of solder interconnects 150, and at least one pillar interconnect from the plurality of pillar interconnects 152. Thus, a current and/or signal between the integrated device 305 and the integrated device 105 may bypass the integrated device 103.

FIG. 4 illustrates a package 400 that includes a substrate with an embedded integrated device. The package 400 includes a substrate 202, an integrated device 103, an integrated device 105 and an integrated device 305. In some implementations, the integrated device 103 may be configured as a deep trench capacitor device. In some implementations, the integrated device 103 may be configured as a bridge. In some implementations, the integrated device 103 may be replaced by a bridge that includes a plurality of bridge interconnects. The bridge may include a die substrate. The plurality of bridge interconnects may be formed over a surface of the die substrate. The package 400 is similar to the package 200 of FIG. 2. However, the package 400 illustrates two integrated devices coupled to the substrate 202. The integrated device 105 is coupled to the substrate 202 and the integrated device 305 is coupled to the substrate 202. The plurality of interconnects 284 includes a plurality of interconnects 284*a* and a plurality of interconnects 284*b*. The plurality of pillar interconnects 132 includes a plurality of pillar interconnects 132*a* and a plurality of pillar interconnects 132*b*. The plurality of solder interconnects 130 includes a plurality of solder interconnects 130*a* and a plurality of solder interconnects 130*b*.

The integrated device 105 is coupled to the substrate 202 through a plurality of solder interconnects 150. The integrated device 105 may include a plurality of pillar interconnects 152. The plurality of solder interconnects 150 may be coupled to the plurality of pillar interconnects 152 and the plurality of interconnects 284. The plurality of solder interconnects 150 may be located between the plurality of pillar interconnects 152 and the plurality of interconnects 284. The plurality of solder interconnects 130 may be located between the plurality of pillar interconnects 132 and the plurality of interconnects 284. An underfill 110 may be located between the integrated device 105 and the substrate 202. The underfill 110 may laterally surround the plurality of pillar interconnects 152 and the plurality of solder interconnects 150.

A front side of the integrated device 105 may face the substrate 202. The front side of the integrated device 105 may face towards the integrated device 103. A front side of the integrated device 103 may face towards the integrated device 105.

The integrated device 305 is coupled to the substrate 202 through a plurality of solder interconnects 350. The integrated device 305 may include a plurality of pillar interconnects 352. The plurality of solder interconnects 350 may be coupled to the plurality of pillar interconnects 352 and the plurality of interconnects 284. The plurality of solder interconnects 350 may be located between the plurality of pillar interconnects 352 and the plurality of interconnects 284. The plurality of solder interconnects 130 may be located between the plurality of pillar interconnects 132 and the plurality of interconnects 284. An underfill 110 may be located between the integrated device 305 and the substrate 202. The underfill 110 may laterally surround the plurality of pillar interconnects 352 and the plurality of solder interconnects 350.

A front side of the integrated device 305 may face the substrate 202. The front side of the integrated device 305 may face towards the integrated device 103. A front side of the integrated device 103 may face towards the integrated device 305.

In some implementations, an electrical path between the integrated device 105 and the integrated device 103 may include at least one pillar interconnect from the plurality of pillar interconnects 152, at least one solder interconnect from plurality of solder interconnects 150, at least one interconnect from the plurality of interconnects 284, at least one solder interconnect from the plurality of solder interconnects 130 and at least one pillar interconnect from the plurality of pillar interconnects 132.

In some implementations, an electrical path between the integrated device 305 and the integrated device 103 may include at least one pillar interconnect from the plurality of pillar interconnects 352, at least one solder interconnect from plurality of solder interconnects 350, at least one interconnect from the plurality of interconnects 284, at least one solder interconnect from the plurality of solder interconnects 130 and at least one pillar interconnect from the plurality of pillar interconnects 132.

In some implementations, an electrical path 470 between the integrated device 305 and the integrated device 105 may include at least one pillar interconnect from the plurality of pillar interconnects 352, at least one solder interconnect from plurality of solder interconnects 350, at least one interconnect from the plurality of interconnects **284*b*, at least one solder interconnect from the plurality of solder interconnects 130*b*, at least one pillar interconnect from the plurality of pillar interconnects 132*b*, the integrated device 103, at least one pillar interconnect from the plurality of pillar interconnects 132*a*, at least one solder interconnect from the plurality of solder interconnects 130*a*, at least one interconnect from the plurality of interconnects 284*a*, at least one solder interconnect from plurality of solder interconnects 150, and at least one pillar interconnect from the plurality of pillar interconnects 152. The electrical path 470 may be configured to provide an electrical path for signals (e.g., input/output signals) between the integrated device 305 and the integrated device 105**.

In some implementations, an electrical path between the integrated device 305 and the integrated device 105 may include at least one pillar interconnect from the plurality of pillar interconnects 352, at least one solder interconnect from plurality of solder interconnects 350, at least one interconnect from the plurality of interconnects 284, at least one solder interconnect from plurality of solder interconnects 150, and at least one pillar interconnect from the plurality of pillar interconnects 152. Thus, a current and/or signal between the integrated device 305 and the integrated device 105 may bypass the integrated device 103.

In some implementations, the integrated device 103, the integrated device 105 and/or the integrated device 305 may be chiplets. For example, in some implementations, the integrated device 103 may be a first chiplet and the integrated device 105 may be a second chiplet, and the integrated device 305 may be a third chiplet. In some implementations, one of more of integrated devices described in the disclosure may be fabricated using the same technology node or two or more different technology nodes. For example, a chiplet (e.g., 105) may be fabricated using a first technology node, and another chiplet (e.g., 305) may be fabricated using a second technology node that is not as advanced as the first technology node. In such an example, a chiplet (e.g., 105) may include components (e.g., interconnects, transistors) that have a first minimum size, and the other chiplet (e.g., 305) may include components (e.g., interconnects, transistors) that have a second minimum size, where the second minimum size is greater than the first minimum size. In some implementations, the integrated device 105 and the integrated device 305 of a package, may be fabricated using the same technology node or different technology nodes. In some implementations, a chiplet (e.g., 103) and another chiplet (e.g., 105, 305) of a package, may be fabricated using the same technology node or different technology nodes.

As another example, in some implementations, the integrated device 105 may be a first chiplet and the integrated device 305 may be a second chiplet. The integrated device 105 may be configured to perform a first plurality of functions and/or operations. The integrated device 305 may be configured to perform a second plurality of functions and/or operations. The second plurality of functions and/or operations includes at least one function and/or operation that is different from the first plurality of functions and/or operations. In some implementations, the integrated device 105 may be fabricated using a first technology node, and the integrated device 305 may be fabricated using a second technology node that is not as advanced as the first technology node. In some implementations, the integrated device 103 may be fabricated using a third technology node that is different from the first technology node and/or the second technology node.

Figure 5:
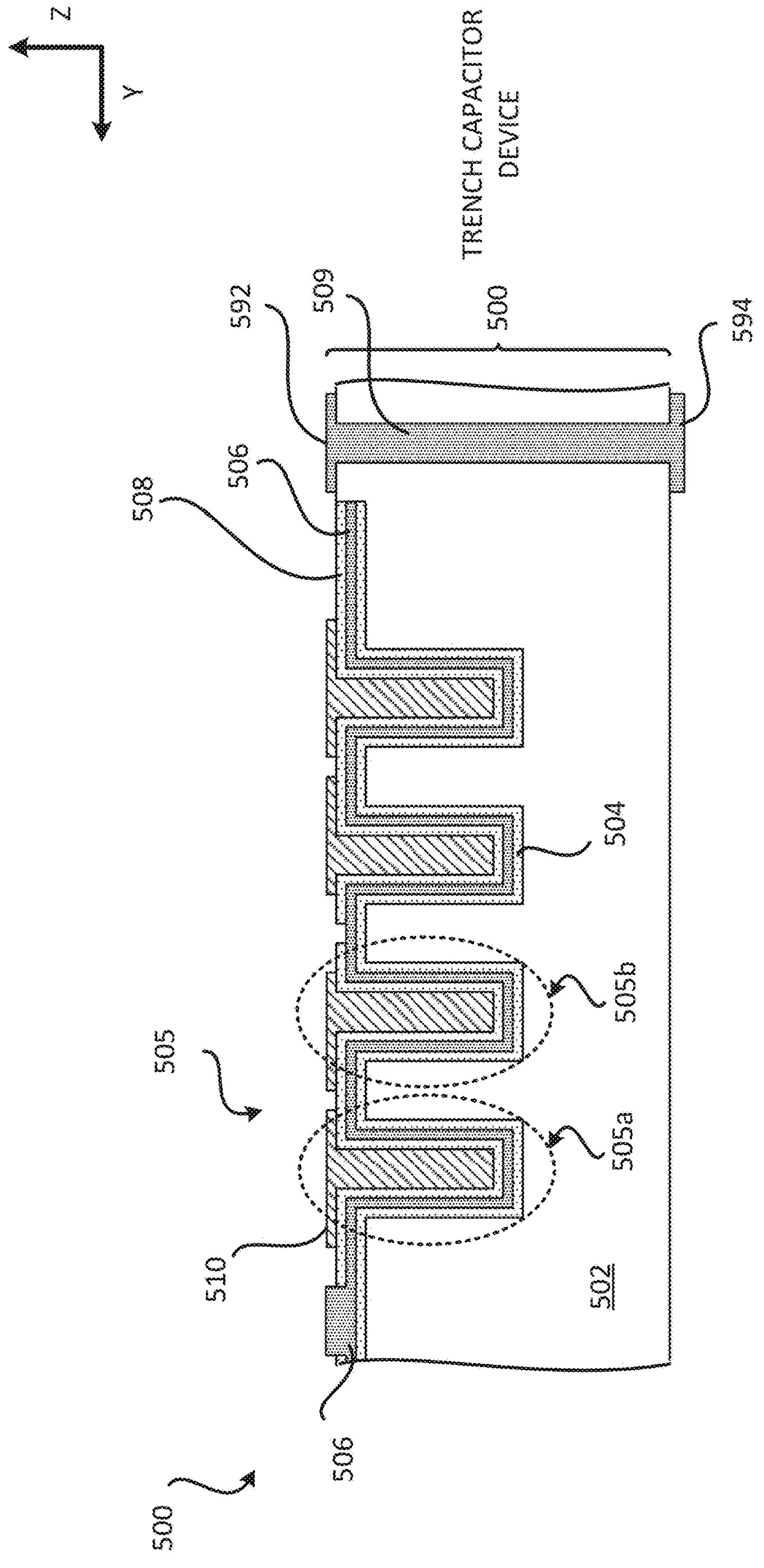
FIG. 5 illustrates a cross sectional profile view of an exemplary deep trench capacitor device.

As mentioned above, in some implementations, the integrated device 103 may be configured as a deep trench capacitor. FIG. 5 illustrates a cross sectional profile view of an integrated device 500 that configured as a trench capacitor device. The integrated device 500 may be an integrated passive device that includes multiple trench capacitors (e.g., deep trench capacitors). The integrated device 500 may be a means for trench capacitance. The integrated device 500 may represent the integrated device 103. The integrated device 500 includes a front side and a back side. The front side of the integrated device 500 may include the plurality of trench capacitors.

The integrated device 500 includes a die substrate 502 and a plurality of trench capacitors 505. A plurality of solder interconnects (not shown) may be coupled to the integrated device 500. The die substrate 502 may include silicon (Si). The die substrate 502 may include a plurality of trenches and/or cavities over which capacitors may be formed.

The plurality of trench capacitors 505 includes a trench capacitor 505*a* and a trench capacitor 505*b*. The trench capacitor 505*a* and the trench capacitor 505*b* may be configured to be part of a same capacitor (e.g., first capacitor, first trench capacitor). The trench capacitor 505*a* and the trench capacitor 505*b* may be configured to be coupled to and/or part of a first power distribution network (PDN). The trench capacitor 505*a* and the trench capacitor 505*b* may be configured to be part of a first electrical path for a first power for a package. The trench capacitor 505*a* and the trench capacitor 505*b* may be configured to be coupled to integrated device(s).

As shown in FIG. 5, the integrated device 500 includes the die substrate 502, an oxide layer 504, a first electrically conductive layer 506, a dielectric layer 508, and a second electrically conductive layer 510. The first electrically conductive layer 506 and/or the second electrically conductive layer 510 may include polysilicon. The oxide layer 504 and/or the dielectric layer 508 may include $SiO_2$ (e.g., low-pressure chemical vapor deposition (LPCVD) $SiO_2$) or $Si_3N_4$ (e.g., LPCVD $Si_3N_4$). Portions of the oxide layer 504, the first electrically conductive layer 506, the dielectric layer 508, and the second electrically conductive layer 510 may be located in trenches and/or cavities of the die substrate 502. It is noted that a die substrate 502 may be considered to have a trench or a cavity, even if the trench or the cavity is filled with one or more materials.

The trench capacitor 505*a* (e.g., first trench capacitor, first capacitor, means for first trench capacitance) may be defined by (i) a first portion of the oxide layer 504, (ii) a first portion of the first electrically conductive layer 506, (iii) a first portion of the dielectric layer 508, and (iv) a first portion of the second electrically conductive layer 510 that are located in a trench (e.g., first trench) of the die substrate 502.

The trench capacitor 505*b* (e.g., second trench capacitor, second capacitor, means for second trench capacitance) may be defined by (i) a second portion of the oxide layer 504, (ii) a second portion of the first electrically conductive layer 506, (iii) a second portion of the dielectric layer 508, and (iv) a second portion of the second electrically conductive layer 510 that are located in a trench (e.g., second trench) of the die substrate 502. It is noted that trench capacitor 505*b* may be part of a same capacitor as the trench capacitor 505*a*. That is, the trench capacitor 505*a* and the trench capacitor 505*b* may be configured to be electrically coupled together to form a capacitor (e.g., first capacitor) with a greater capacitance.

The integrated device 500 may also include an interconnect 509, an interconnect 592 and an interconnect 594. The interconnect 509 is coupled to the interconnect 592 and the interconnect 594. The interconnect 509 may be a through substrate via that extends through the die substrate 502. The interconnect 592 may be a pad interconnect. The interconnect 594 may be a pad interconnect. The interconnect 592 may be located on the front side of the integrated device 500. The interconnect 592 may be located on the back side of the integrated device 500. The interconnect 509 may be a through die substrate interconnect. The integrated device may include at least one through die substrate interconnect.

An integrated device (e.g., 103, 105, 305) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SIC) based integrated device, a memory, power management processor, and/or combinations thereof. An integrated device (e.g., 103, 105, 305) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Thus, for example, a single integrated device may be split into several chiplets. As mentioned above, using several chiplets that perform several functions may reduce the overall cost of a package relative to using a single chip to perform all of the functions of a package. In some implementations, one or more of the chiplets and/or one or more of integrated devices (e.g., 103) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, an integrated device and another integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Exemplary Sequence for Fabricating a Package Comprising a Substrate With an Embedded Integrated Device In some implementations, fabricating a package includes several processes. FIGS. 6A-6E illustrate an exemplary sequence for providing or fabricating a package. In some implementations, the sequence of FIGS. 6A-6E may be used to provide or fabricate the package 100. However, the process of FIGS. 6A-6E may be used to fabricate other packages described in the disclosure.

It should be noted that the sequence of FIGS. 6A-6E may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Figure 6A:
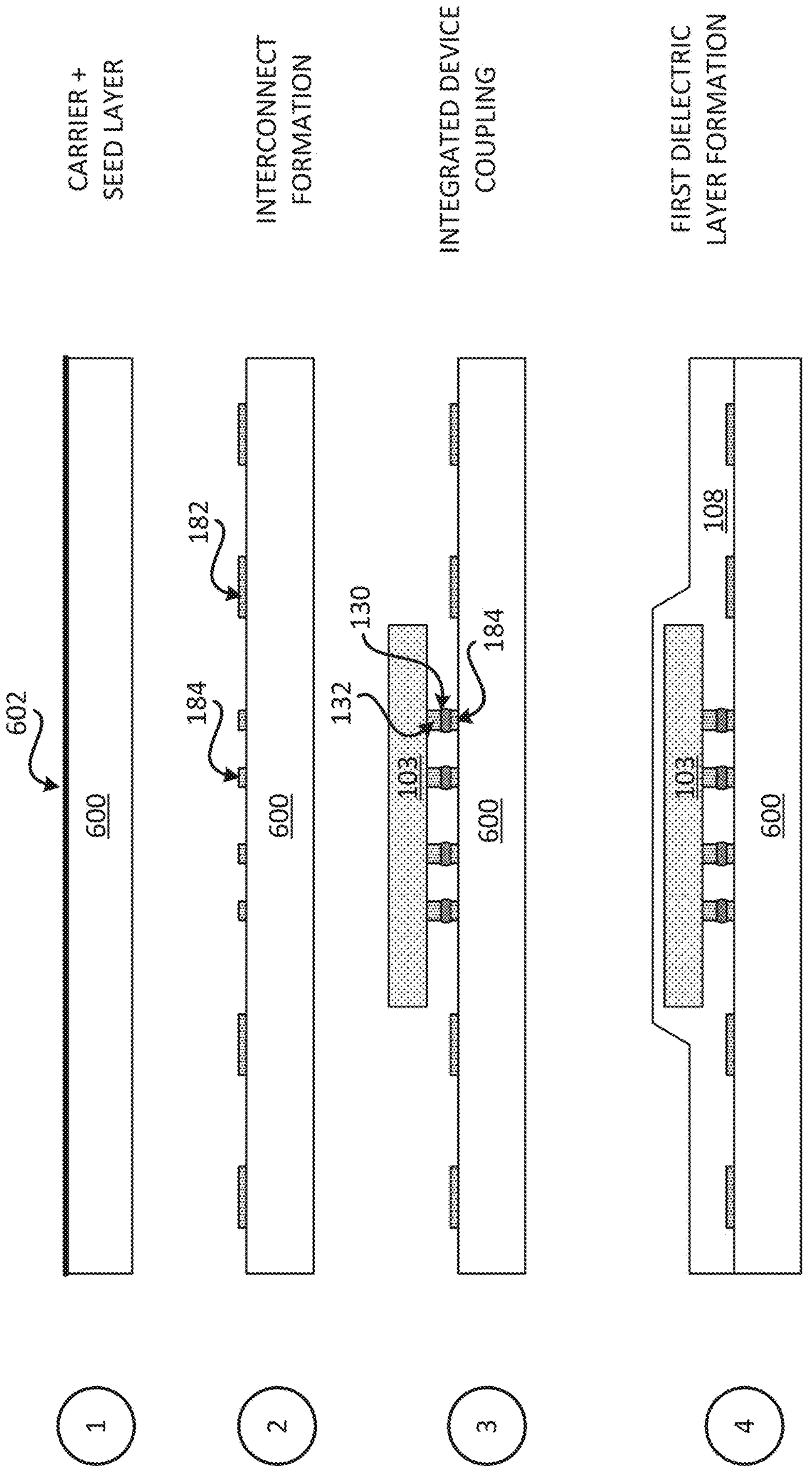
FIGS. 6A-6E illustrate an exemplary sequence for fabricating a package that includes a substrate with an embedded integrated device.

Stage 1, as shown in FIG. 6A, illustrates a state after a carrier 600 and a seed layer 602 are provided. The seed layer 602 may be located on a surface of the carrier 600. The seed layer 602 may include a copper layer.

Stage 2 illustrates a state after a plurality of interconnects 182 are formed over the carrier 600. Forming the plurality of interconnects 182 may include forming a plurality of interconnects 184. The seed layer 602 may be part of the plurality of interconnects 182 and/or the plurality of interconnects 184. A masking, a plating and/or an etching process may be used to form the plurality of interconnects 182 and/or the plurality of interconnects 184.

Stage 3 illustrates a state after an integrated device 103 is coupled to the plurality of interconnects 184. The integrated device 103 may include the plurality of pillar interconnects 132. The integrated device 103 is coupled to the plurality of interconnects 184 through a plurality of solder interconnects 130. A solder reflow process may be used to couple the integrated device 103 to the plurality of interconnects 184. The plurality of solder interconnects 130 may be coupled to the plurality of pillar interconnects 132 and the plurality of interconnects 184. In some implementations, the integrated device 103 may be configured as a deep trench capacitor. In some implementations, the integrated device 103 may be configured as a bridge. In some implementations, the plurality of pillar interconnects 132 may be optional. In such instances, the plurality of solder interconnects 130 may be coupled to other interconnects of the integrated device 103.

Stage 4 illustrates a state after a dielectric layer 108 is provided. The dielectric layer 108 may be formed over the carrier 600 and the integrated device 103. A vacuum lamination process may be used to form the dielectric layer 108. The dielectric layer 108 may encapsulate the integrated device 103, the plurality of interconnects 182, the plurality of interconnects 184, the plurality of solder interconnects 130 and the plurality of pillar interconnects 132. The dielectric layer 108 may include ABF (or no glass reinforced resin). The dielectric layer 108 may be a first dielectric layer.

Figure 6B:
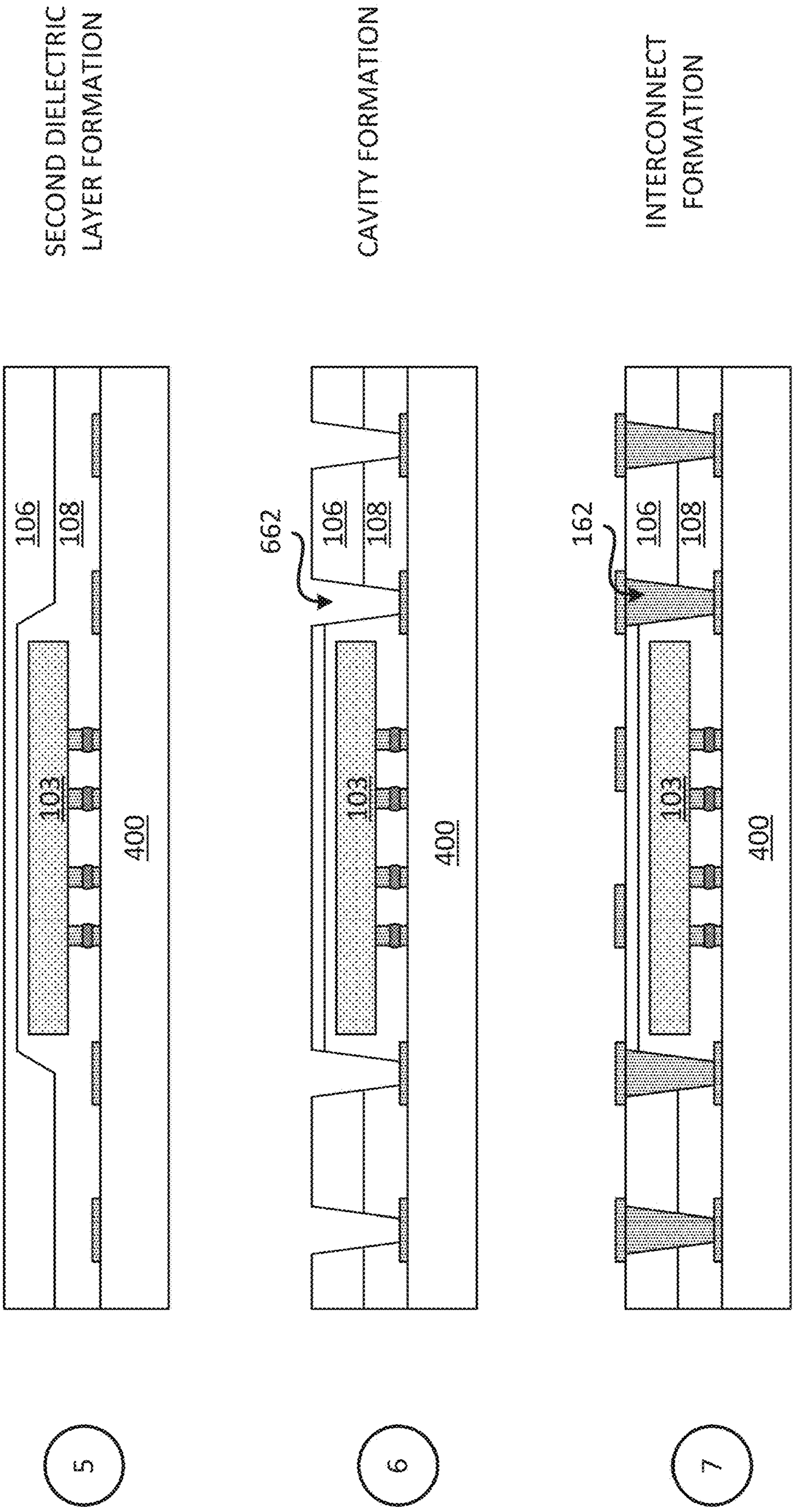

Stage 5, as shown in FIG. 6B, illustrates a state after a dielectric layer 106 is formed over a surface of the dielectric layer 108. A deposition and/or lamination process may be used to form the dielectric layer 106. In some implementations, the dielectric layer 106 may include the same material or a different material as the dielectric layer 108. The dielectric layer 106 is provided such that the dielectric layer 106 has a relatively flat surface. The dielectric layer 106 may be a second dielectric layer. The dielectric layer 106 may include ABF or prepreg.

Stage 6 illustrates a state after a plurality of cavities 662 are formed in the dielectric layer 106 and the dielectric layer 108. The plurality of cavities 662 may be formed using an etching process (e.g., photo etching process) and/or a laser process. A masking, an exposure and/or a development process may be used to form the plurality of cavities 662.

Stage 7 illustrates a state after a plurality of interconnects 162 are formed in and over surfaces of the dielectric layer 106 and/or the dielectric layer 108. The plurality of interconnects 162 may be coupled to the plurality of interconnects 182. A masking, a plating and/or an etching process may be used to form the plurality of interconnects 162.

Figure 6C:
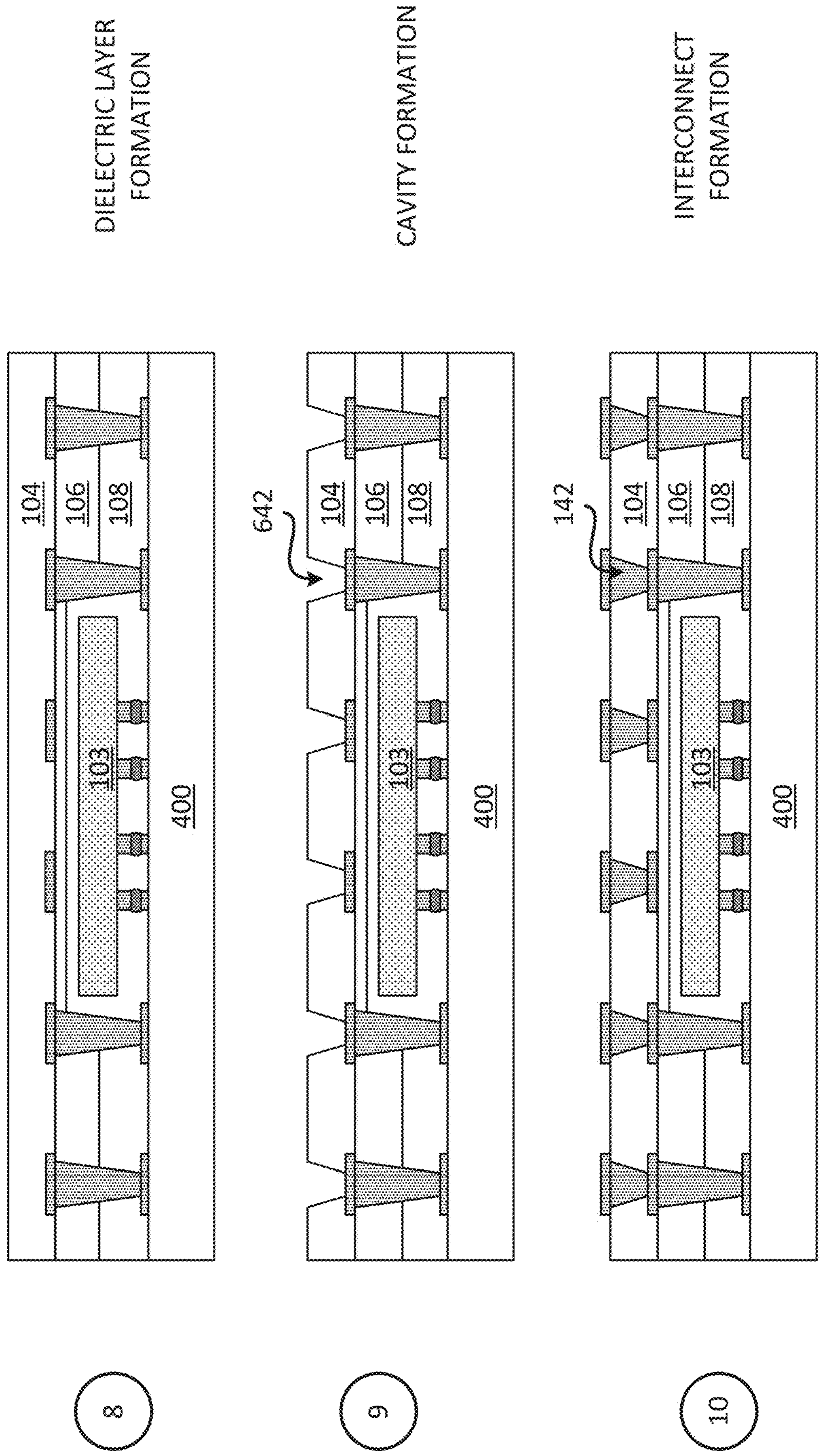

Stage 8, as shown in FIG. 6C, illustrates a state after a dielectric layer 104 is formed over a surface of the dielectric layer 106. A deposition and/or lamination process may be used to form the dielectric layer 104. In some implementations, the dielectric layer 104 may include the same material or a different material as the dielectric layer 108 and/or the dielectric layer 106. The dielectric layer 104 is provided such that the dielectric layer 104 has a relatively flat surface. The dielectric layer 104 may be a third dielectric layer. The dielectric layer 104 may include prepreg.

Stage 9 illustrates a state after a plurality of cavities 642 are formed in the dielectric layer 104. The plurality of cavities 642 may be formed using an etching process (e.g., photo etching process) and/or a laser process. A masking, an exposure and/or a development process may be used to form the plurality of cavities 642.

Stage 10 illustrates a state after a plurality of interconnects 142 are formed in and over surface of the dielectric layer 104. The plurality of interconnects 142 may be coupled to the plurality of interconnects 162. A masking, a plating and/or an etching process may be used to form the plurality of interconnects 142.

Figure 6D:
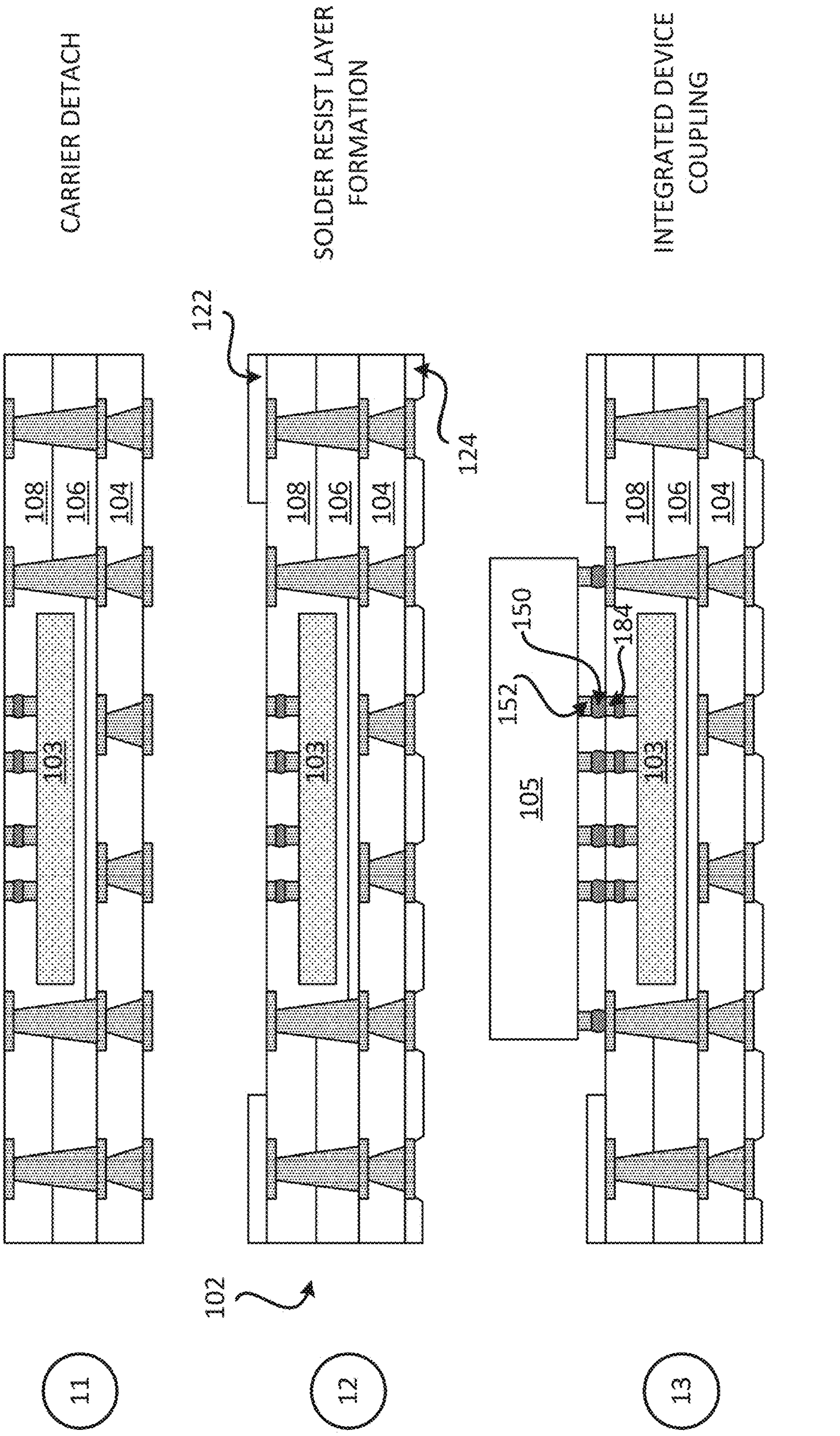

Stage 11, as shown in FIG. 6D, illustrates a state after the carrier 600 is decoupled. The carrier 600 may be detached from the dielectric layer 108. In some implementations, at least some of the seed layer 602 may be removed and/or detached.

Stage 12 illustrates a state after a solder resist layer 122 and a solder resist layer 124 are formed. The solder resist layer 122 may be formed over (e.g., above) the dielectric layer 108. The solder resist layer 122 may include openings that expose portions of the plurality of interconnects 182 and/or the plurality of interconnects 184. The solder resist layer 124 may be formed over (e.g., below) the dielectric layer 104. The solder resist layer 124 may include openings that expose portions of the plurality of interconnects 142. A deposition, lamination, a masking, an exposure and/or a development process may be used to form the solder resist layers and the openings in the solder resist layers. Stages 1 through 12 may illustrate a sequence for fabricating a substrate (e.g., 102). Once the substrate is fabricated, an assembly process may be used to couple the substrate to one or more integrated devices to form a package. The assembly process to form the package may be performed by a different factory than the factory that fabricated the substrate, or by the same factory that fabricated the substrate.

Stage 13 illustrates a state after an integrated device 105 is coupled to the plurality of interconnects 184. The integrated device 105 may include the plurality of pillar interconnects 152. The integrated device 105 is coupled to the plurality of interconnects 184 through a plurality of solder interconnects 150. A solder reflow process may be used to couple the integrated device 105 to the plurality of interconnects 184. The plurality of solder interconnects 150 may be coupled to the plurality of pillar interconnects 152 and the plurality of interconnects 184.

Figure 6E:
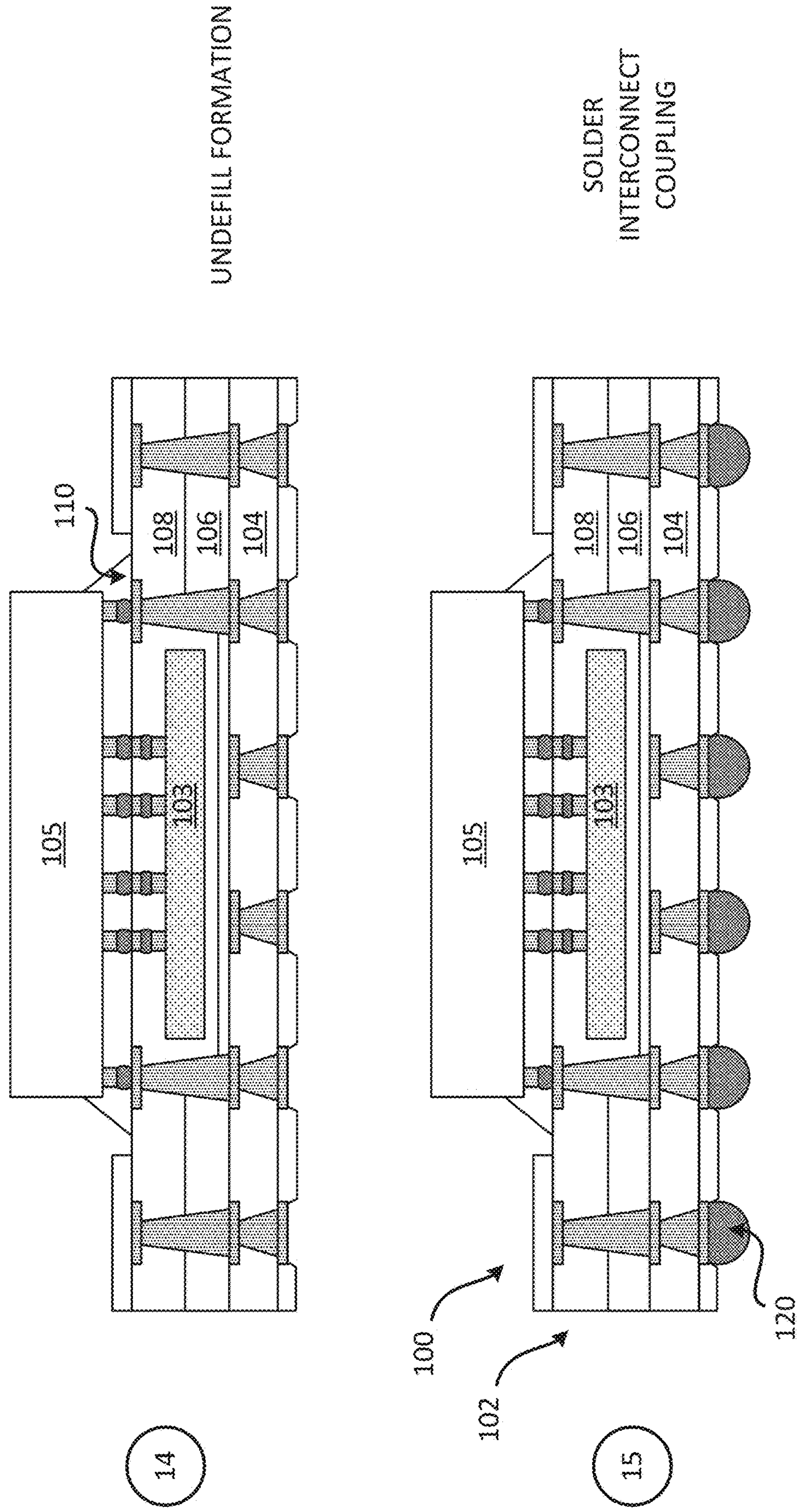

Stage 14, as shown in FIG. 6E, illustrates a state after an underfill 110 is provided between the integrated device 105 and the substrate 102. A deposition and/or injection process may be used to form and/or provide the underfill 110.

Stage 15 illustrates a state after the plurality of solder interconnects 120 are coupled to the substrate 102. A solder reflow process may be used to form and couple the plurality of solder interconnects 120. The plurality of solder interconnects 120 may be coupled to the plurality of interconnects 142. Stage 15 may illustrate the package 100.

Figure 7:
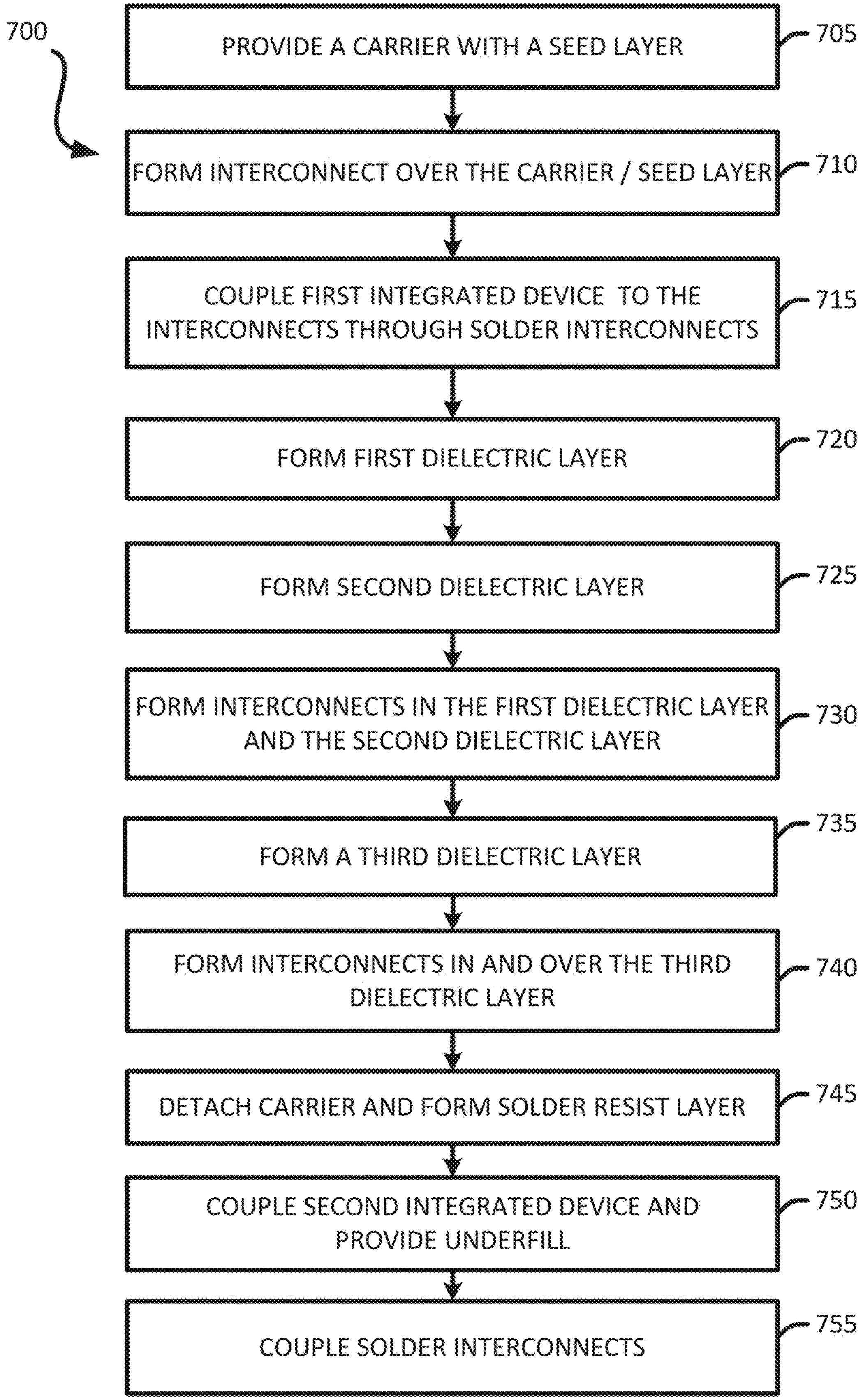
FIG. 7 illustrates an exemplary flow diagram of a method for fabricating a package that includes a substrate with an embedded integrated device.

Exemplary Flow Diagram of a Method for Fabricating a Package Comprising a Substrate With an Embedded Integrated Device In some implementations, fabricating a package includes several processes. FIG. 7 illustrates an exemplary flow diagram of a method 700 for providing or fabricating a package. In some implementations, the method 700 of FIG. 7 may be used to provide or fabricate any of the packages of FIGS. 1-4. FIG. 7 will be described with respect to fabricating the package 100. However, FIG. 7 may be used to fabricate any package.

It should be noted that the method 700 of FIG. 7 may combine one or more processes in order to simplify and/or clarify the method for providing or fabricating a package. In some implementations, the order of the processes may be changed or modified.

The method provides (at 705) a carrier with a seed layer. Stage 1 of FIG. 6A, illustrates and describes an example of a carrier 600 and a seed layer 602 that are provided. The seed layer 602 may be located on a surface of the carrier 600. The seed layer 602 may include a copper layer.

The method forms (at 710) interconnects over the carrier and seed layer. Stage 2 of FIG. 6A, illustrates and describes an example of a plurality of interconnects 182 that are formed over the carrier 600. Forming the plurality of interconnects 182 may include forming a plurality of interconnects 184. The seed layer 602 may be part of the plurality of interconnects 182 and/or the plurality of interconnects 184. A masking, a plating and/or an etching process may be used to form the plurality of interconnects 182 and/or the plurality of interconnects 184.

The method couples (at 715) an integrated device to the plurality of interconnects. Stage 3 of FIG. 6A, illustrates and describes an example of an integrated device 103 that is coupled to the plurality of interconnects 184. The integrated device 103 may include the plurality of pillar interconnects 132. The integrated device 103 is coupled to the plurality of interconnects 184 through a plurality of solder interconnects 130. A solder reflow process may be used to couple the integrated device 103 to the plurality of interconnects 184. The plurality of solder interconnects 130 may be coupled to the plurality of pillar interconnects 132 and the plurality of interconnects 184. In some implementations, the integrated device 103 may be configured as a deep trench capacitor. In some implementations, the integrated device 103 may be configured as a bridge. In some implementations, the plurality of pillar interconnects 132 may be optional. In such instances, the plurality of solder interconnects 130 may be coupled to other interconnects of the integrated device 103.

The method forms (at 720) a first dielectric layer. Stage 4 of FIG. 6A, illustrates and describes an example of a dielectric layer 108 that is provided. The dielectric layer 108 may be formed over the carrier 600 and the integrated device 103. A vacuum lamination process may be used to form the dielectric layer 108. The dielectric layer 108 may encapsulate the integrated device 103, the plurality of interconnects 182, the plurality of interconnects 184, the plurality of solder interconnects 130 and the plurality of pillar interconnects 132. The dielectric layer 108 may include ABF (or no glass reinforced resin). The dielectric layer 108 may be a first dielectric layer.

The method forms (at 725) a second dielectric layer. Stage 5 of FIG. 6B, illustrates and describes an example of a dielectric layer 106 that is formed over a surface of the dielectric layer 108. A deposition and/or lamination process may be used to form the dielectric layer 106. In some implementations, the dielectric layer 106 may include the same material or a different material as the dielectric layer 108. The dielectric layer 106 is provided such that the dielectric layer 106 has a relatively flat surface. The dielectric layer 106 may be a second dielectric layer. The dielectric layer 106 may include ABF or prepreg. Forming the first and/or second dielectric layers may include forming cavities in the dielectric layer(s). Stage 6 of FIG. 6B, illustrates and describes a plurality of cavities 662 that are formed in the dielectric layer 106 and the dielectric layer 108. The plurality of cavities 662 may be formed using an etching process (e.g., photo etching process) and/or a laser process. A masking, an exposure and/or a development process may be used to form the plurality of cavities 662.

The method forms (at 730) interconnects in the dielectric layer. Stage 7 of FIG. 6B, illustrates and describes an example of a plurality of interconnects 162 that are formed in and over surfaces of the dielectric layer 106 and/or the dielectric layer 108. The plurality of interconnects 162 may be coupled to the plurality of interconnects 182. A masking, a plating and/or an etching process may be used to form the plurality of interconnects 162.

The method forms (at 735) a third dielectric layer. Stage 8 of FIG. 6C, illustrates and describes an example of a dielectric layer 104 that is formed over a surface of the dielectric layer 106. A deposition and/or lamination process may be used to form the dielectric layer 104. In some implementations, the dielectric layer 104 may include the same material or a different material as the dielectric layer 108 and/or the dielectric layer 106. The dielectric layer 104 is provided such that the dielectric layer 104 has a relatively flat surface. The dielectric layer 104 may be a third dielectric layer. The dielectric layer 104 may include prepreg. In some implementations, forming the dielectric layer may include forming cavities in the dielectric layer. Stage 9 of FIG. 6C, illustrates and describes an example of a plurality of cavities 642 that are formed in the dielectric layer 104. The plurality of cavities 642 may be formed using an etching process (e.g., photo etching process) and/or a laser process. A masking, an exposure and/or a development process may be used to form the plurality of cavities 642.

The method forms (at 740) interconnects in the third dielectric layer. Stage 10 of FIG. 10C, illustrates and describes an example of a plurality of interconnects 142 that are formed in and over surface of the dielectric layer 104. The plurality of interconnects 142 may be coupled to the plurality of interconnects 162. A masking, a plating and/or an etching process may be used to form the plurality of interconnects 142.

The method decouples (at 745) the carrier and forms (at 745) solder resist layers. Stage 11 of FIG. 6D, illustrates and describes an example of a carrier 600 that is decoupled. The carrier 600 may be detached from the dielectric layer 108. In some implementations, at least some of the seed layer 602 may be removed and/or detached. Stage 12 of FIG. 6D, illustrates and describes an example of a solder resist layer 122 and a solder resist layer 124 are formed. The solder resist layer 122 may be formed over (e.g., above) the dielectric layer 108. The solder resist layer 122 may include openings that expose portions of the plurality of interconnects 182 and/or the plurality of interconnects 184. The solder resist layer 124 may be formed over (e.g., below) the dielectric layer 104. The solder resist layer 124 may include openings that expose portions of the plurality of interconnects 142. A deposition, lamination, a masking, an exposure and/or a development process may be used to form the solder resist layers and the openings in the solder resist layers. Stages 1 through 12 may illustrate a sequence for fabricating a substrate (e.g., 102). Once the substrate is fabricated, an assembly process may be used to couple the substrate to one or more integrated devices to form a package. The assembly process to form the package may be performed by a different factory than the factory that fabricated the substrate, or by the same factory that fabricated the substrate.

The method couples (at 750) a second integrated device to the substrate. Stage 13 of FIG. 6D, illustrates and describes an example of an integrated device 105 that is coupled to the plurality of interconnects 184. The integrated device 105 may include the plurality of pillar interconnects 152. The integrated device 105 is coupled to the plurality of interconnects 184 through a plurality of solder interconnects 150. A solder reflow process may be used to couple the integrated device 105 to the plurality of interconnects 184. The plurality of solder interconnects 150 may be coupled to the plurality of pillar interconnects 152 and the plurality of interconnects 184. The method may also provide (at 750) an underfill between the second integrated device and the substrate. Stage 14 FIG. 6E, illustrates and describes an example of an underfill 110 that is provided between the integrated device 105 and the substrate 102. A deposition and/or injection process may be used to form and/or provide the underfill 110.

The method couples (at 755) solder interconnects to the substrate. Stage 15 of FIG. 6E, illustrates and describes an example of a plurality of solder interconnects 120 that are coupled to the substrate 102. A solder reflow process may be used to form and couple the plurality of solder interconnects 120. The plurality of solder interconnects 120 may be coupled to the plurality of interconnects 142. Stage 15 may illustrate the package 100.

Exemplary Sequence for Fabricating a Package Comprising a Substrate With an Embedded Integrated Device In some implementations, fabricating a package includes several processes. FIGS. 8A-8E illustrate an exemplary sequence for providing or fabricating a package. In some implementations, the sequence of FIGS. 8A-8E may be used to provide or fabricate the package 200. However, the process of FIGS. 8A-8E may be used to fabricate other packages described in the disclosure.

It should be noted that the sequence of FIGS. 8A-8E may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Figure 8A:
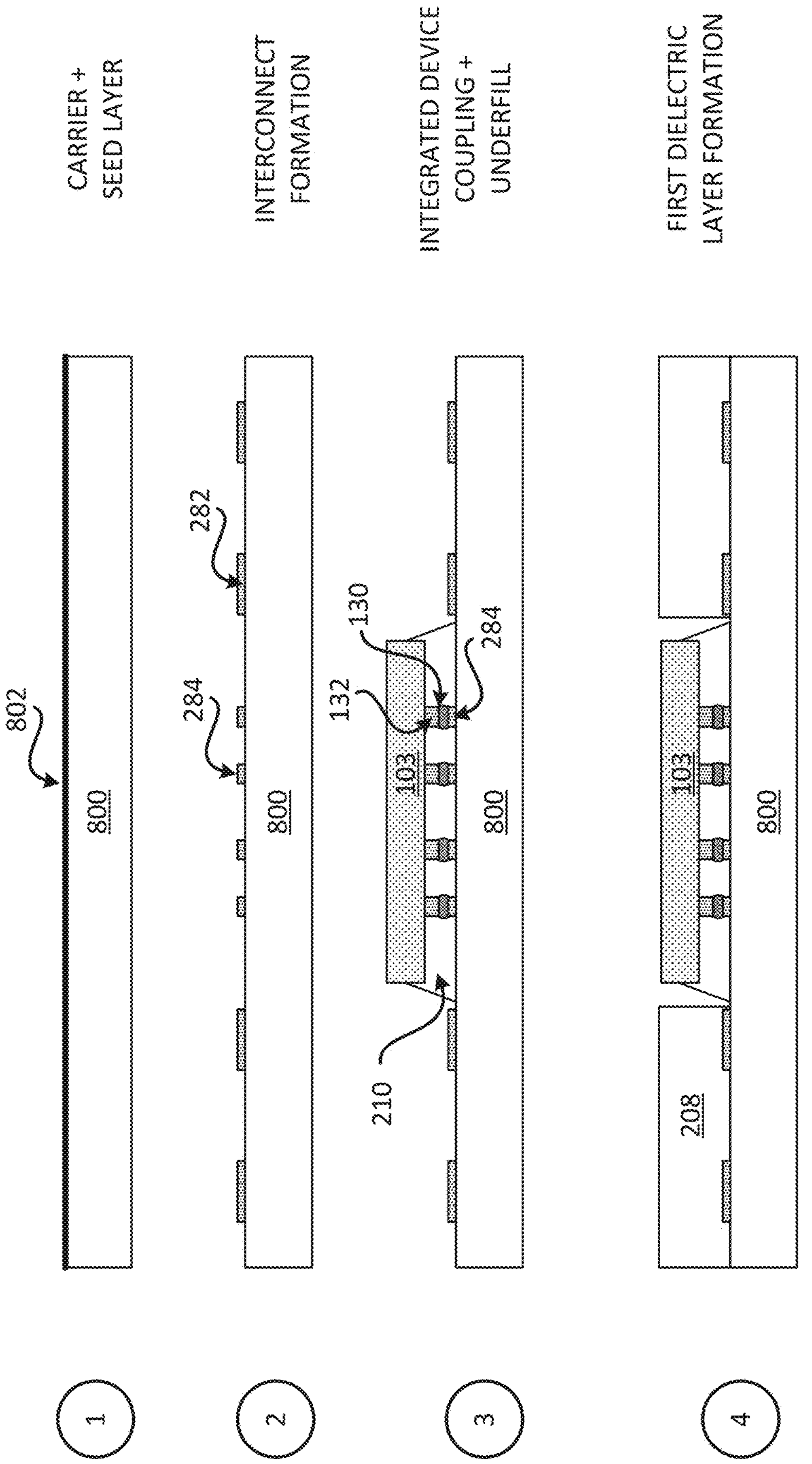
FIGS. 8A-8E illustrate an exemplary sequence for fabricating a package that includes a substrate with an embedded integrated device.

Stage 1, as shown in FIG. 8A, illustrates a state after a carrier 800 and a seed layer 802 are provided. The seed layer 802 may be located on a surface of the carrier 800. The seed layer 802 may include a copper layer.

Stage 2 illustrates a state after a plurality of interconnects 282 are formed over the carrier 800. Forming the plurality of interconnects 282 may include forming a plurality of interconnects 284. The seed layer 802 may be part of the plurality of interconnects 282 and/or the plurality of interconnects 284. A masking, a plating and/or an etching process may be used to form the plurality of interconnects 282 and/or the plurality of interconnects 284.

Stage 3 illustrates a state after an integrated device 103 is coupled to the plurality of interconnects 284. The integrated device 103 may include the plurality of pillar interconnects 132. The integrated device 103 is coupled to the plurality of interconnects 284 through a plurality of solder interconnects 130. A solder reflow process may be used to couple the integrated device 103 to the plurality of interconnects 284. The plurality of solder interconnects 130 may be coupled to the plurality of pillar interconnects 132 and the plurality of interconnects 284. In some implementations, the integrated device 103 may be configured as a deep trench capacitor. In some implementations, the integrated device 103 may be configured as a bridge. In some implementations, the plurality of pillar interconnects 132 may be optional. In such instances, the plurality of solder interconnects 130 may be coupled to other interconnects of the integrated device 103. Stage 3 also illustrates an underfill 210 that is provided between the integrated device 103 and the carrier 800. A deposition and/or injection process may be used to form and/or provide the underfill 210.

Stage 4 illustrates a state after a dielectric layer 208 is provided. The dielectric layer 208 may be formed over the carrier 800 The dielectric layer 208 may be located laterally around the integrated device 103 and the underfill 210. A lamination process may be used to form the dielectric layer 208. The dielectric layer 208 may include prepreg or ABF. The dielectric layer 208 may be a first dielectric layer.

Figure 8B:
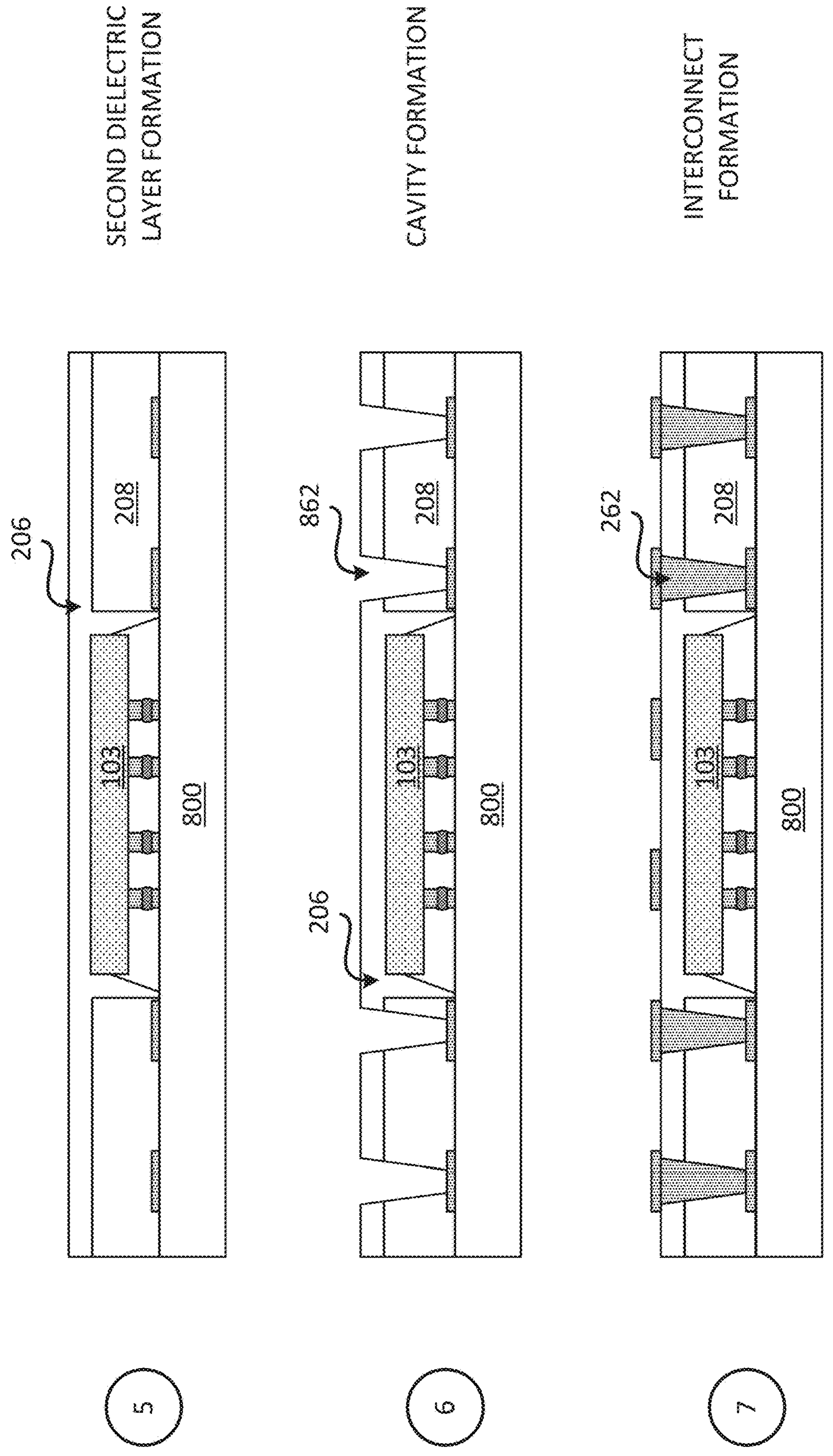

Stage 5, as shown in FIG. 8B, illustrates a state after a dielectric layer 206 is formed over a surface of the dielectric layer 208 and the integrated device 103. The dielectric layer 206 may be coupled to and touch the back side of the integrated device 103. A deposition and/or lamination process may be used to form the dielectric layer 206. In some implementations, the dielectric layer 206 may include the same material or a different material as the dielectric layer 208. The dielectric layer 206 is provided such that the dielectric layer 206 has a relatively flat surface. The dielectric layer 206 may be a second dielectric layer. The dielectric layer 206 may include ABF (or no glass reinforced resin).

Stage 6 illustrates a state after a plurality of cavities 862 are formed in the dielectric layer 206 and the dielectric layer 208. The plurality of cavities 862 may be formed using an etching process (e.g., photo etching process) and/or a laser process. A masking, an exposure and/or a development process may be used to form the plurality of cavities 862.

Stage 7 illustrates a state after a plurality of interconnects 262 are formed in and over surfaces of the dielectric layer 206 and/or the dielectric layer 208. The plurality of interconnects 262 may be coupled to the plurality of interconnects 282. A masking, a plating and/or an etching process may be used to form the plurality of interconnects 262.

Figure 8C:
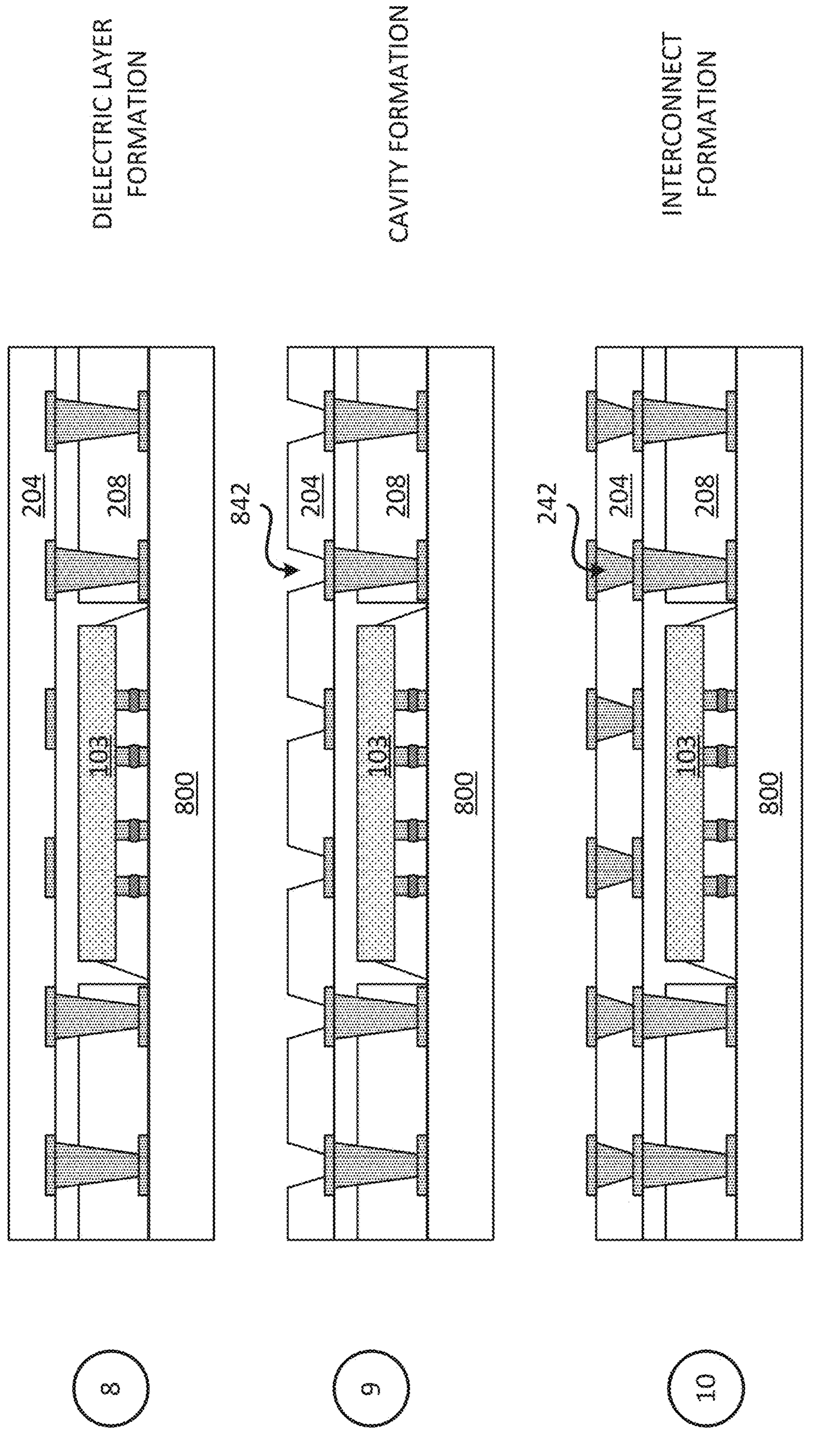

Stage 8, as shown in FIG. 8C, illustrates a state after a dielectric layer 204 is formed over a surface of the dielectric layer 206. A deposition and/or lamination process may be used to form the dielectric layer 204. In some implementations, the dielectric layer 204 may include the same material or a different material as the dielectric layer 208 and/or the dielectric layer 206. The dielectric layer 204 is provided such that the dielectric layer 204 has a relatively flat surface. The dielectric layer 204 may be a third dielectric layer. The dielectric layer 204 may include prepreg.

Stage 9 illustrates a state after a plurality of cavities 842 are formed in the dielectric layer 204. The plurality of cavities 842 may be formed using an etching process (e.g., photo etching process) and/or a laser process. A masking, an exposure and/or a development process may be used to form the plurality of cavities 842.

Stage 10 illustrates a state after a plurality of interconnects 242 are formed in and over surface of the dielectric layer 204. The plurality of interconnects 242 may be coupled to the plurality of interconnects 262. A masking, a plating and/or an etching process may be used to form the plurality of interconnects 242.

Figure 8D:
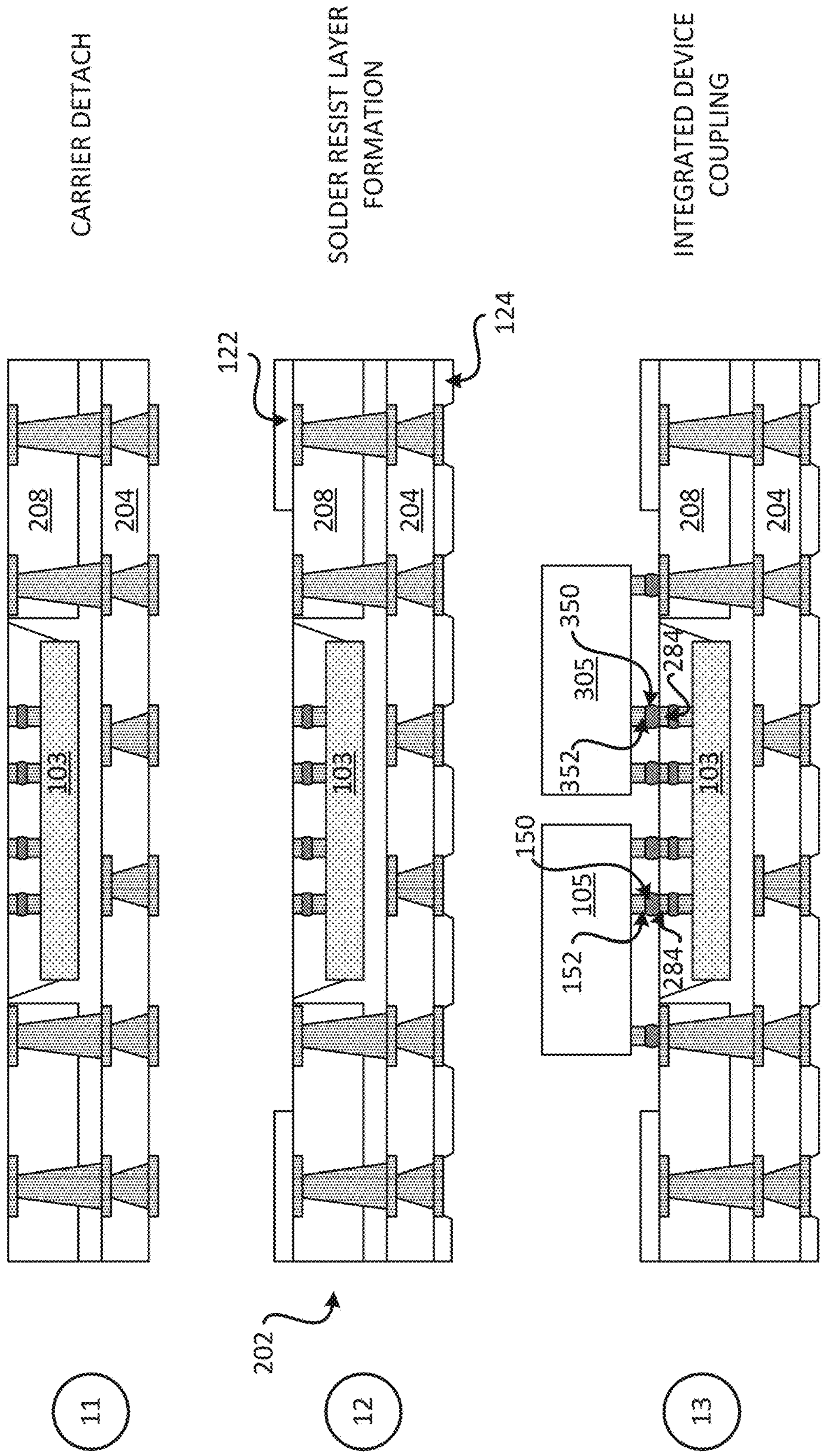

Stage 11, as shown in FIG. 8D, illustrates a state after the carrier 800 is decoupled. The carrier 800 may be detached from the dielectric layer 208. In some implementations, at least some of the seed layer 802 may be removed and/or detached.

Stage 12 illustrates a state after a solder resist layer 122 and a solder resist layer 124 are formed. The solder resist layer 122 may be formed over (e.g., above) the dielectric layer 208. The solder resist layer 122 may include openings that expose portions of the plurality of interconnects 282 and/or the plurality of interconnects 284. The solder resist layer 124 may be formed over (e.g., below) the dielectric layer 204. The solder resist layer 124 may include openings that expose portions of the plurality of interconnects 242. A deposition, lamination, a masking, an exposure and/or a development process may be used to form the solder resist layers and the openings in the solder resist layers. Stages 1 through 12 may illustrate a sequence for fabricating a substrate (e.g., 202). Once the substrate is fabricated, an assembly process may be used to couple the substrate to one or more integrated devices to form a package. The assembly process to form the package may be performed by a different factory than the factory that fabricated the substrate, or by the same factory that fabricated the substrate.

Stage 13 illustrates a state after an integrated device 105 and an integrated device 305 are coupled to the substrate 202. The integrated device 105 may be coupled to the plurality of interconnects 284. The integrated device 105 may include the plurality of pillar interconnects 152. The integrated device 105 is coupled to the plurality of interconnects 284 through a plurality of solder interconnects 150. A solder reflow process may be used to couple the integrated device 105 to the plurality of interconnects 284. The plurality of solder interconnects 150 may be coupled to the plurality of pillar interconnects 152 and the plurality of interconnects 284. The integrated device 305 may be coupled to the plurality of interconnects 284. The integrated device 305 may include the plurality of pillar interconnects 352. The integrated device 305 is coupled to the plurality of interconnects 284 through a plurality of solder interconnects 350. A solder reflow process may be used to couple the integrated device 305 to the plurality of interconnects 284. The plurality of solder interconnects 350 may be coupled to the plurality of pillar interconnects 352 and the plurality of interconnects 284.

Figure 8E:
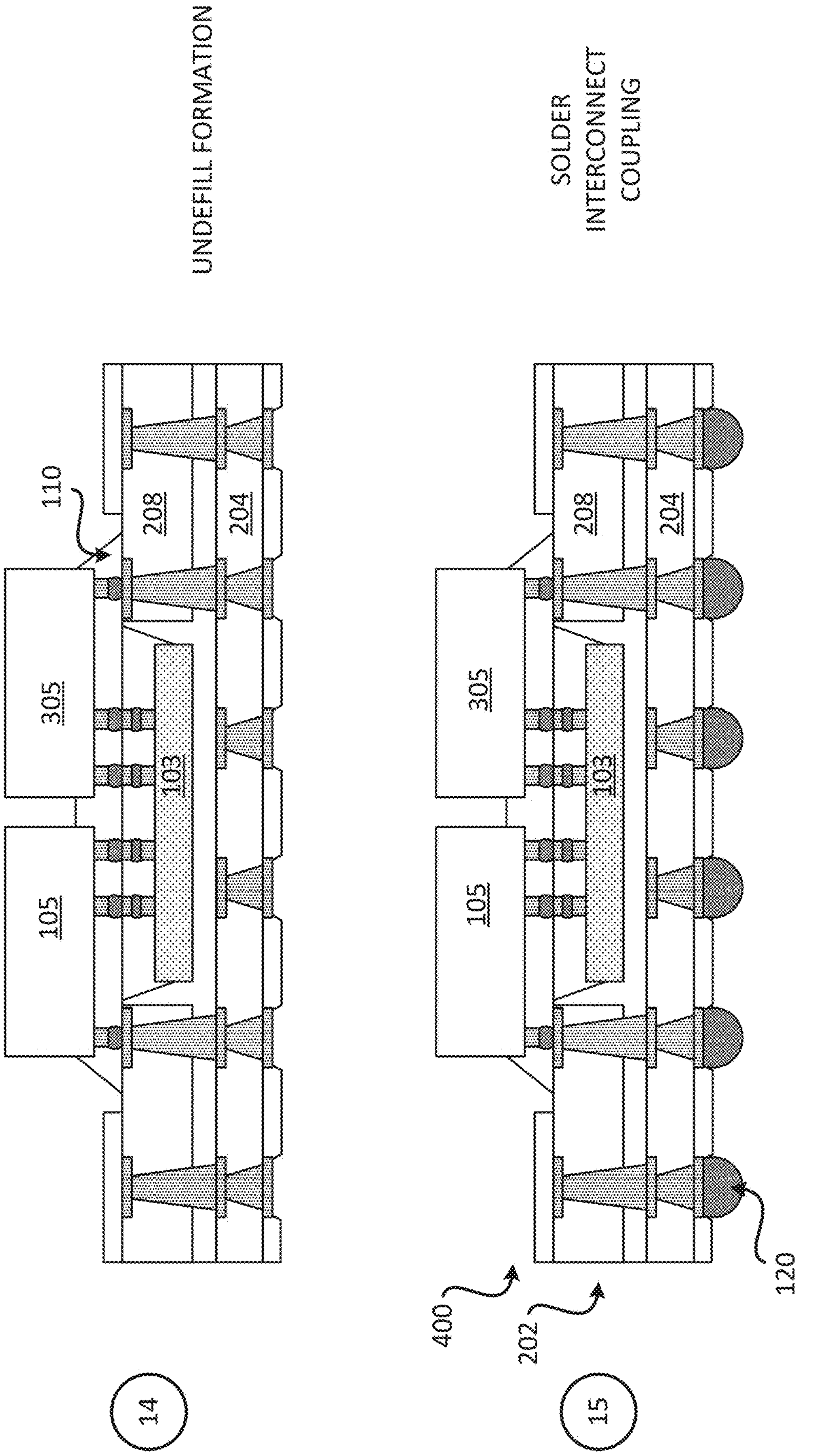

Stage 14, as shown in FIG. 8E, illustrates a state after an underfill 110 is provided between the integrated device 105 and the substrate 202. The underfill 110 may also be provided between the integrated device 305 and the substrate 202. A deposition and/or injection process may be used to form and/or provide the underfill 110.

Stage 15 illustrates a state after the plurality of solder interconnects 120 are coupled to the substrate 202. A solder reflow process may be used to form and couple the plurality of solder interconnects 120. The plurality of solder interconnects 120 may be coupled to the plurality of interconnects 242. Stage 15 may illustrate the package 400.

Figure 9:
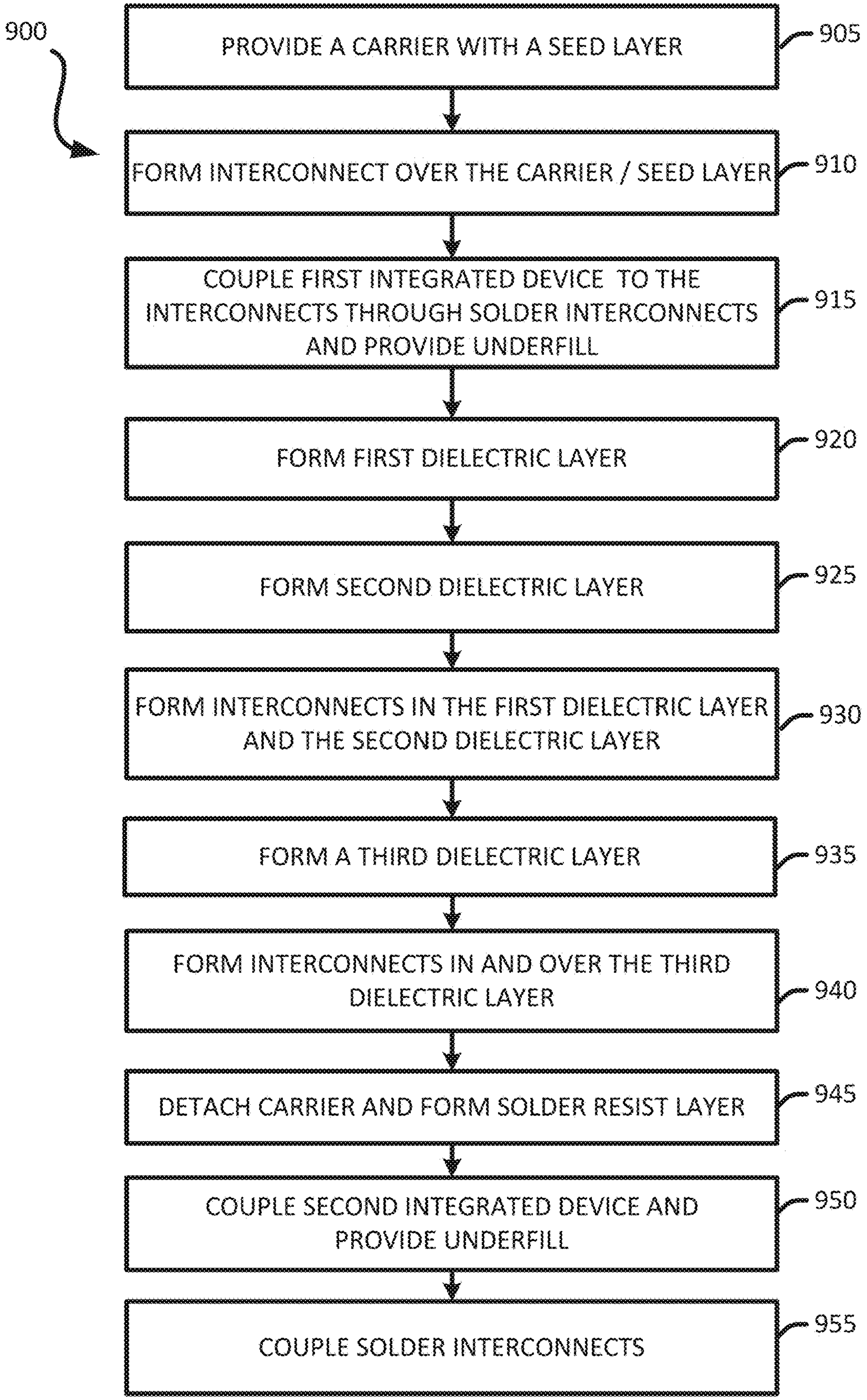
FIG. 9 illustrates an exemplary flow diagram of a method for fabricating a package that includes a substrate with an embedded integrated device.

Exemplary Flow Diagram of a Method for Fabricating a Package Comprising a Substrate With an Embedded Integrated Device In some implementations, fabricating a package includes several processes. FIG. 9 illustrates an exemplary flow diagram of a method 900 for providing or fabricating a package. In some implementations, the method 900 of FIG. 9 may be used to provide or fabricate any of the packages of FIGS. 1-4. FIG. 9 will be described with respect to fabricating the package 400. However, FIG. 9 may be used to fabricate any package.

It should be noted that the method 900 of FIG. 9 may combine one or more processes in order to simplify and/or clarify the method for providing or fabricating a package. In some implementations, the order of the processes may be changed or modified.

The method provides (at 905) a carrier with a seed layer. Stage 1 of FIG. 8A, illustrates and describes an example of a carrier 800 and a seed layer 802 that are provided. The seed layer 802 may be located on a surface of the carrier 800. The seed layer 802 may include a copper layer.

The method forms (at 910) interconnects over the carrier and seed layer. Stage 2 of FIG. 8A, illustrates and describes an example of a plurality of interconnects 282 that are formed over the carrier 800. Forming the plurality of interconnects 282 may include forming a plurality of interconnects 284. The seed layer 802 may be part of the plurality of interconnects 282 and/or the plurality of interconnects 284. A masking, a plating and/or an etching process may be used to form the plurality of interconnects 282 and/or the plurality of interconnects 284.

The method couples (at 915) an integrated device to the plurality of interconnects. Stage 3 of FIG. 8A, illustrates and describes an example of an integrated device 103 that is coupled to the plurality of interconnects 284. The integrated device 103 may include the plurality of pillar interconnects 132. The integrated device 103 is coupled to the plurality of interconnects 284 through a plurality of solder interconnects 130. A solder reflow process may be used to couple the integrated device 103 to the plurality of interconnects 284. The plurality of solder interconnects 130 may be coupled to the plurality of pillar interconnects 132 and the plurality of interconnects 284. In some implementations, the integrated device 103 may be configured as a deep trench capacitor. In some implementations, the integrated device 103 may be configured as a bridge. In some implementations, the plurality of pillar interconnects 132 may be optional. In such instances, the plurality of solder interconnects 130 may be coupled to other interconnects of the integrated device 103. The method may also form (at 915) an underfill between the integrated device and the plurality of interconnects. Stage 3 of FIG. 8A, illustrates and describes an example of an underfill 210 that is provided between the integrated device 103 and the carrier 800. A deposition and/or injection process may be used to form and/or provide the underfill 210.

The method forms (at 920) a first dielectric layer Stage 4 of FIG. 8A, illustrates and describes an example of a dielectric layer 208 is provided. The dielectric layer 208 may be formed over the carrier 800 The dielectric layer 208 may be located laterally around the integrated device 103 and the underfill 210. A lamination process may be used to form the dielectric layer 208. The dielectric layer 208 may include prepreg or ABF. The dielectric layer 208 may be a first dielectric layer.

The method forms (at 925) a second dielectric layer. Stage 5 of FIG. 8B, illustrates and describes an example of a dielectric layer 206 that is formed over a surface of the dielectric layer 208 and the integrated device 103. The dielectric layer 206 may be coupled to and touch the back side of the integrated device 103. A deposition and/or lamination process may be used to form the dielectric layer 206. In some implementations, the dielectric layer 206 may include the same material or a different material as the dielectric layer 208. The dielectric layer 206 may include ABF (or no glass reinforced resin). The dielectric layer 206 is provided such that the dielectric layer 206 has a relatively flat surface. The dielectric layer 206 may be a second dielectric layer. Forming the first and/or second dielectric layers may include forming cavities in the dielectric layer(s). Stage 6 of FIG. 8B, illustrates and describes an example of a plurality of cavities 862 that are formed in the dielectric layer 206 and the dielectric layer 208. The plurality of cavities 862 may be formed using an etching process (e.g., photo etching process) and/or a laser process. A masking, an exposure and/or a development process may be used to form the plurality of cavities 862.

The method forms (at 930) interconnects in the dielectric layer. Stage 7 of FIG. 8B illustrates and describes an example of a plurality of interconnects 262 that are formed in and over surfaces of the dielectric layer 206 and/or the dielectric layer 208. The plurality of interconnects 262 may be coupled to the plurality of interconnects 282. A masking, a plating and/or an etching process may be used to form the plurality of interconnects 262.

The method forms (at 935) a third dielectric layer. Stage 8 of FIG. 8C, illustrates and describes an example of a dielectric layer 204 that is formed over a surface of the dielectric layer 206. A deposition and/or lamination process may be used to form the dielectric layer 204. In some implementations, the dielectric layer 204 may include the same material or a different material as the dielectric layer 208 and/or the dielectric layer 206. The dielectric layer 204 is provided such that the dielectric layer 204 has a relatively flat surface. The dielectric layer 204 may be a third dielectric layer. The dielectric layer 204 may include prepreg. In some implementations, forming the dielectric layer may include forming cavities in the dielectric layer. Stage 9 of FIG. 8C, illustrates and describes an example of a plurality of cavities 842 that are formed in the dielectric layer 204. The plurality of cavities 842 may be formed using an etching process (e.g., photo etching process) and/or a laser process. A masking, an exposure and/or a development process may be used to form the plurality of cavities 842.

The method forms (at 940) a plurality of interconnects in the third dielectric layer. Stage 10 of FIG. 8C, illustrates and describes an example of a plurality of interconnects 242 that are formed in and over surface of the dielectric layer 204. The plurality of interconnects 242 may be coupled to the plurality of interconnects 262. A masking, a plating and/or an etching process may be used to form the plurality of interconnects 242.

The method decouples (at 945) the carrier and forms (at 945) solder resist layers. Stage 11 of FIG. 8D, illustrates and describes an example of a carrier 800 that is decoupled. The carrier 800 may be detached from the dielectric layer 208. In some implementations, at least some of the seed layer 802 may be removed and/or detached. Stage 12 of FIG. 8D, illustrates and describes an example of a solder resist layer 122 and a solder resist layer 124 that are formed. The solder resist layer 122 may be formed over (e.g., above) the dielectric layer 208. The solder resist layer 122 may include openings that expose portions of the plurality of interconnects 282 and/or the plurality of interconnects 284. The solder resist layer 124 may be formed over (e.g., below) the dielectric layer 204. The solder resist layer 124 may include openings that expose portions of the plurality of interconnects 242. A deposition, lamination, a masking, an exposure and/or a development process may be used to form the solder resist layers and the openings in the solder resist layers. Stages 1 through 12 may illustrate a sequence for fabricating a substrate (e.g., 202). Once the substrate is fabricated, an assembly process may be used to couple the substrate to one or more integrated devices to form a package. The assembly process to form the package may be performed by a different factory than the factory that fabricated the substrate, or by the same factory that fabricated the substrate.

The method couples (at 950) at least one second integrated device to the substrate. Stage 13 of FIG. 8D, illustrates and describes an example of an integrated device 105 and an integrated device 305 that are coupled to the substrate 202. The integrated device 105 may be coupled to the plurality of interconnects 284. The integrated device 105 may include the plurality of pillar interconnects 152. The integrated device 105 is coupled to the plurality of interconnects 284 through a plurality of solder interconnects 150. A solder reflow process may be used to couple the integrated device 105 to the plurality of interconnects 284. The plurality of solder interconnects 150 may be coupled to the plurality of pillar interconnects 152 and the plurality of interconnects 284. The integrated device 305 may be coupled to the plurality of interconnects 284. The integrated device 305 may include the plurality of pillar interconnects 352. The integrated device 305 is coupled to the plurality of interconnects 284 through a plurality of solder interconnects 350. A solder reflow process may be used to couple the integrated device 305 to the plurality of interconnects 284. The plurality of solder interconnects 350 may be coupled to the plurality of pillar interconnects 352 and the plurality of interconnects 284. The method may also provide (at 950) an underfill between the integrated devices and the substrate. Stage 14 of FIG. 8E, illustrates and describes an example of an underfill 110 that is provided between the integrated device 105 and the substrate 202. The underfill 110 may also be provided between the integrated device 305 and the substrate 202. A deposition and/or injection process may be used to form and/or provide the underfill 110.

The method couples (at 955) solder interconnects to the substrate. Stage 15 of FIG. 8E, illustrates and describes an example of a plurality of solder interconnects 120 that are coupled to the substrate 202. A solder reflow process may be used to form and couple the plurality of solder interconnects 120. The plurality of solder interconnects 120 may be coupled to the plurality of interconnects 242. Stage 15 may illustrate the package 400.

Exemplary Electronic Devices

Figure 10:
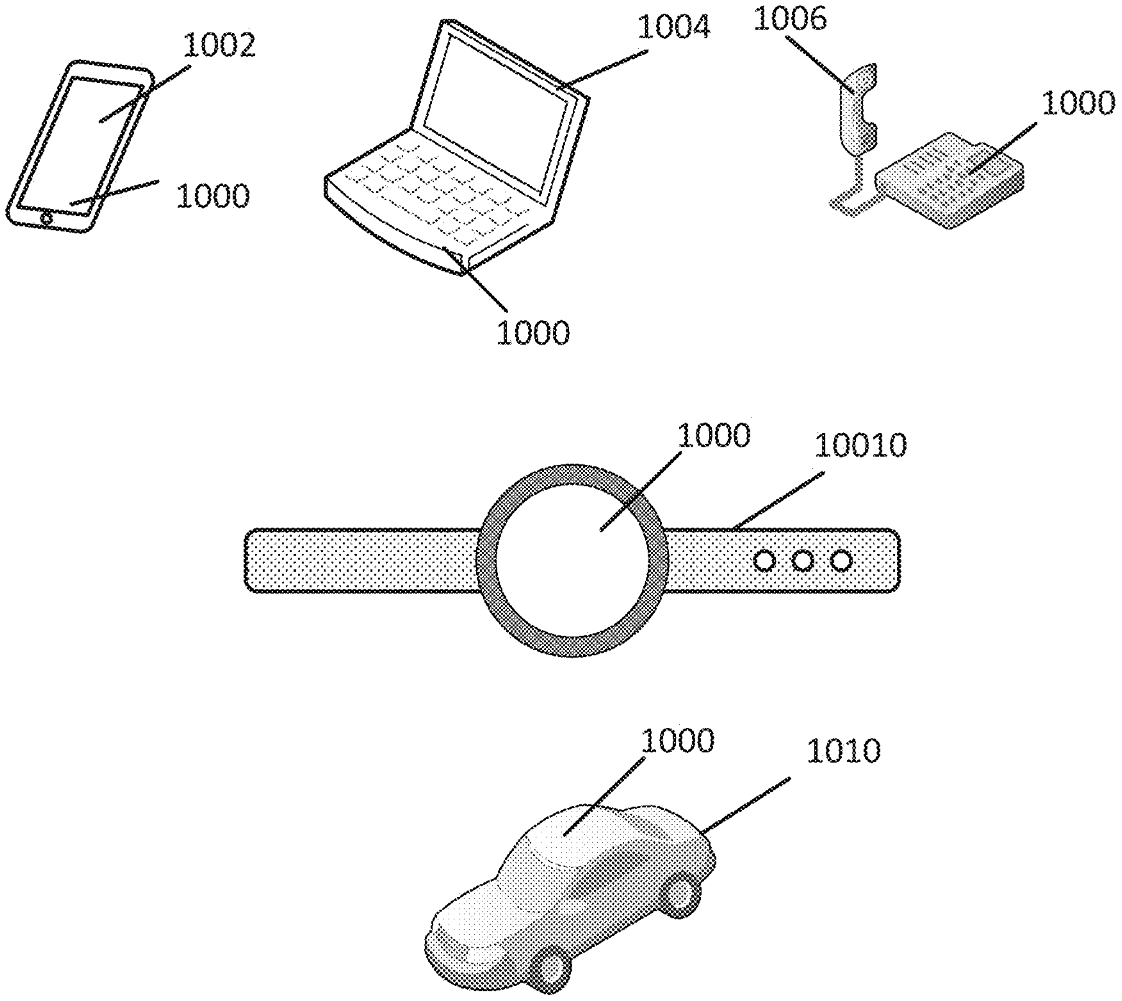
FIG. 10 illustrates various electronic devices that may integrate a die, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-5, 6A-6E, 7, 8A-8E and/or 9-10 may be rearranged and/or combined into a single component, process, feature or function or embodied in several components, processes, or functions. Additional elements, components, processes, and/or functions may also be added without departing from the disclosure. It should also be noted FIGS. 1-5, 6A-6E, 7, 8A-8E and/or 9-10 and its corresponding description in the present disclosure is not limited to dies and/or ICs. In some implementations, FIGS. 1-5, 6A-6E, 7, 8A-8E and/or 9-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or an electro plating process or electroless plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate that includes at least one dielectric layer; a plurality of interconnects comprising a first plurality of interconnects; and a first integrated device located at least partially in the substrate, wherein the first integrated device is coupled to the first plurality of interconnects through a first plurality of solder interconnects. The package includes a second integrated device coupled to the first plurality of interconnects through a second plurality of solder interconnects.

Aspect 2: The package of aspect 1, wherein the first integrated device includes a deep trench capacitor.

Aspect 3: The package of aspects 1 through 2, wherein an electrical path between the first integrated device and the second integrated device includes (i) a solder interconnect from the first plurality of solder interconnects, (ii) an interconnect from the first plurality of interconnects, and (iii) a solder interconnect from the second plurality of solder interconnects.

Aspect 4: The package of aspects 1 through 3, wherein the first integrated device is coupled to the first plurality of interconnects through a first plurality of pad interconnects and a first plurality of solder interconnects, and wherein the second integrated device is coupled to the first plurality of interconnects through a second plurality of pillar interconnects and a second plurality of solder interconnects.

Aspect 5: The package of aspect 4, wherein an electrical path between the first integrated device and the second integrated device includes (i) a pad interconnect from the first plurality of pad interconnects, (ii) a solder interconnect from the first plurality of solder interconnects, (iii) an interconnect from the first plurality of interconnects, (iv) a solder interconnect from the second plurality of solder interconnects, and (v) a pillar interconnect from the second plurality of solder interconnects.

Aspect 6: The package of aspects 1 through 3, wherein the first integrated device is coupled to the first plurality of interconnects through a first plurality of pillar interconnects and a first plurality of solder interconnects, and wherein the second integrated device is coupled to the first plurality of interconnects through a second plurality of pillar interconnects and a second plurality of solder interconnects.

Aspect 7: The package of aspect 6, wherein an electrical path between the first integrated device and the second integrated device includes (i) a pillar interconnect from the first plurality of pillar interconnects, (ii) a solder interconnect from the first plurality of solder interconnects, (iii) an interconnect from the first plurality of interconnects, (iv) a solder interconnect from the second plurality of solder interconnects, and (v) a pillar interconnect from the second plurality of solder interconnects.

Aspect 8: The package of aspects 1 through 7, further comprising an underfill located between the second integrated device and the substrate.

Aspect 9: The package of aspects 1 through 7, further comprising: a first underfill located laterally around the first plurality of interconnects and the first plurality of solder interconnects; and a second underfill located between the second integrated device and the substrate, wherein the second underfill is touching the first underfill.

Aspect 10: The package of aspect 9, wherein the first underfill includes a different material from the at least one dielectric layer.

Aspect 11: The package of aspects 1 through 10, wherein the at least one dielectric layer includes a first dielectric layer, a second dielectric layer and a third dielectric layer.

Aspect 12: The package of aspect 11, wherein the plurality of interconnects include a via that extends through the first dielectric layer and the second dielectric layer, and wherein the first dielectric layer is coupled to a back side surface of the first integrated device and a side surface of the first integrated device.

Aspect 13: The package of aspects 1 through 12, further comprising a third integrated device coupled to the first plurality of interconnects through a third plurality of solder interconnects, wherein the first integrated device comprises a bridge, wherein an electrical path between the second integrated device and the third integrated device includes the bridge, wherein the second integrated device includes a first chiplet, and wherein the third integrated device includes a second chiplet.

Aspect 14: The package of aspects 1 through 13, wherein the first integrated device comprises a first front side and a first back side, wherein the second integrated device comprises a second front side and a second back side, wherein the first front side of the first integrated device faces a first direction, and wherein the second front side of the second integrated device faces a second direction that is opposite to the first direction.

Aspect 15: A device comprising a substrate that includes at least one dielectric layer; a plurality of interconnects comprising a first plurality of interconnects; and a first integrated device located at least partially in the substrate, wherein the first integrated device is coupled to the first plurality of interconnects through a first plurality of solder interconnects. The device includes a second integrated device coupled to the first plurality of interconnects through a second plurality of solder interconnects.

Aspect 16: The device of aspect 15, wherein the first integrated device includes a deep trench capacitor.

Aspect 17: The device of aspects 15 through 16, wherein an electrical path between the first integrated device and the second integrated device includes (i) a solder interconnect from the first plurality of solder interconnects, (ii) an interconnect from the first plurality of interconnects, and (iii) a solder interconnect from the second plurality of solder interconnects.

Aspect 18: The device of aspects 15 through 17, further comprising an underfill located between the second integrated device and the substrate.

Aspect 19: The device of aspects 15 through 17, further comprising a first underfill located laterally around the first plurality of interconnects and the first plurality of solder interconnects; and a second underfill located between the second integrated device and the substrate, wherein the second underfill is touching the first underfill.

Aspect 20: The device of aspect 19, wherein the first underfill includes a different material from the at least one dielectric layer.

Aspect 21: The device of aspects 15 through 20, wherein the at least one dielectric layer includes a first dielectric layer, a second dielectric layer and a third dielectric layer.

Aspect 22: The device of aspect 21, wherein the plurality of interconnects includes a via that extends through the first dielectric layer and the second dielectric layer.

Aspect 23: The device of aspects 21 through 22, wherein the first dielectric layer is coupled to a back side surface of the first integrated device and a side surface of the first integrated device.

Aspect 24: The device of aspects 15 through 23, wherein the first integrated device comprises a first front side and a first back side, wherein the second integrated device comprises a second front side and a second back side, wherein the first front side of the first integrated device faces a first direction, and wherein the second front side of the second integrated device faces a second direction that is opposite to the first direction.

Aspect 25: A method to fabricate a substrate, where fabricating the substrate comprises coupling a first integrated device to a first plurality of interconnects of a carrier, through a first plurality of solder interconnects; forming a first dielectric layer over the carrier and the first integrated device, wherein the first dielectric layer encapsulates the first integrated device, the first plurality of solder interconnects and the first plurality of interconnects; forming a second dielectric layer over a surface of the first dielectric layer; forming a first plurality of cavities in the second dielectric layer and the first dielectric layer; forming a second plurality of interconnects in at least the first plurality of cavities; forming a third dielectric layer over the second dielectric layer; forming a second plurality of cavities in the third dielectric layer; and forming a third plurality of interconnects in at least the second plurality of cavities.

Aspect 26: The method of aspect 25, wherein after forming the substrate, the method further comprises coupling a second integrated device to the first plurality of interconnects through a second plurality of solder interconnects.

Aspect 27: The method of aspect 26, wherein after coupling the second integrated device, the method further comprises forming an underfill between the second integrated device and the first dielectric layer.

Aspect 28: The method of aspects 25 through 26, wherein the first dielectric layer includes ABF and the third dielectric layer includes prepreg.

Aspect 29: The method of aspects 25 through 27, wherein the first integrated device and the first plurality of solder interconnects are located in the substrate.

Aspect 30: A method to fabricates a substrate, where fabricating the substrate comprises coupling a first integrated device to a first plurality of interconnects of a carrier, through a first plurality of solder interconnects; forming a first underfill between the first integrated device and the carrier, wherein the first underfill laterally surrounds the first plurality of solder interconnects; forming a first dielectric layer over the carrier; forming a second dielectric layer over the first integrated device and a surface of the first dielectric layer; forming a first plurality of cavities in the second dielectric layer and the first dielectric layer; forming a second plurality of interconnects in at least the first plurality of cavities; forming a third dielectric layer over the second dielectric layer; forming a second plurality of cavities in the third dielectric layer; and forming a third plurality of interconnects in at least the second plurality of cavities.

Aspect 31: The method of aspect 30, wherein after forming the substrate, the method further comprises coupling a second integrated device to the first plurality of interconnects through a second plurality of solder interconnects.

Aspect 32: The method of aspect 31, wherein after coupling the second integrated device, the method further comprises forming a second underfill between the second integrated device and the first underfill.

Aspect 33: The method of aspects 30 through 32, wherein the first dielectric layer includes ABF or prepreg, the second dielectric layer includes ABF, and the third dielectric layer includes prepreg.

Aspect 34: The method of aspects 30 through 33, wherein the first integrated device, the first plurality of solder interconnects and the first underfill are located in the substrate.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the aspects. As such, the present teachings can be readily applied to other types of apparatuses and many alternatives, modifications, and variations will be apparent to those skilled in the art.

The invention claimed is:

1. A package comprising:

a substrate comprising:

at least one dielectric layer;

a plurality of interconnects comprising a first plurality of interconnects; and a trench capacitor device located at least partially in the substrate, wherein the trench capacitor device comprises a plurality of trench capacitors, wherein the trench capacitor device is free of transistors, wherein the trench capacitor device includes a front side and a back side, and wherein the trench capacitor device is coupled to the first plurality of interconnects through a first plurality of solder interconnects, wherein the same dielectric layer from the at least one dielectric layer touches (i) the front side of the trench capacitor device, (ii) the back side of the trench capacitor device and (iii) a side surface of the trench capacitor device; and an integrated device coupled to the first plurality of interconnects through a second plurality of solder interconnects, wherein the front side of the trench capacitor device faces in a direction towards the integrated device.

2. The package of claim 1, wherein the front side of the trench capacitor device includes a deep trench capacitor.

3. The package of claim 1, wherein an electrical path between the trench capacitor device and the integrated device includes (i) a solder interconnect from the first plurality of solder interconnects, (ii) an interconnect from the first plurality of interconnects, and (iii) a solder interconnect from the second plurality of solder interconnects, and wherein the same dielectric layer from the at least one dielectric layer touches (i) the front side of the trench capacitor device, (ii) the back side of the trench capacitor device, (iii) a side surface of the trench capacitor device, (iv) the solder interconnect from the first plurality of solder interconnects, (v) the interconnect from the first plurality of interconnects and (vi) the solder interconnect from the second plurality of solder interconnects.

4. The package of claim 1, wherein the trench capacitor device is coupled to the first plurality of interconnects through a first plurality of pad interconnects and a first plurality of solder interconnects, and wherein the integrated device is coupled to the first plurality of interconnects through a second plurality of pillar interconnects and a second plurality of solder interconnects.

5. The package of claim 4, wherein an electrical path between the trench capacitor device and the integrated device includes (i) a pad interconnect from the first plurality of pad interconnects, (ii) a solder interconnect from the first plurality of solder interconnects, (iii) an interconnect from the first plurality of interconnects, (iv) a solder interconnect from the second plurality of solder interconnects, and (v) a pillar interconnect from the second plurality of pillar interconnects.

6. The package of claim 1, wherein the trench capacitor device is coupled to the first plurality of interconnects through a first plurality of pillar interconnects and a first plurality of solder interconnects, and wherein the integrated device is coupled to the first plurality of interconnects through a second plurality of pillar interconnects and a second plurality of solder interconnects.

7. The package of claim 6, wherein an electrical path between the trench capacitor device and the integrated device includes (i) a pillar interconnect from the first plurality of pillar interconnects, (ii) a solder interconnect from the first plurality of solder interconnects, (iii) an interconnect from the first plurality of interconnects, (iv) a solder interconnect from the second plurality of solder interconnects, and (v) a pillar interconnect from the second plurality of pillar interconnects.

8. The package of claim 1, further comprising an underfill located between the integrated device and the substrate.

9. The package of claim 1, further comprising:

a first underfill located laterally around the first plurality of interconnects and the first plurality of solder interconnects; and a second underfill located between the integrated device and the substrate, wherein the second underfill is touching the first underfill.

10. The package of claim 9, wherein the first underfill includes a different material from the at least one dielectric layer.

11. The package of claim 1, wherein the at least one dielectric layer includes a first dielectric layer, a second dielectric layer and a third dielectric layer.

12. The package of claim 11, wherein the plurality of interconnects include a via that extends through the first dielectric layer and the second dielectric layer, and wherein the first dielectric layer is coupled to a back side surface of the trench capacitor device and a side surface of the first integrated device.

13. The package of claim 1, further comprising a second integrated device coupled to the first plurality of interconnects through a third plurality of solder interconnects, wherein the trench capacitor device further comprises a plurality of bridge interconnects, wherein an electrical path between the integrated device and the second integrated device includes the plurality of bridge interconnects, wherein the integrated device includes a first chiplet, and wherein the second integrated device includes a second chiplet.

14. The package of claim 1, wherein the integrated device comprises a second front side and a second back side, wherein the front side of the trench capacitor device faces a first direction, and wherein the second front side of the integrated device faces a second direction that is opposite to the first direction.

15. A device comprising:

a substrate comprising:

at least one dielectric layer;

a plurality of interconnects comprising a first plurality of interconnects; and a first integrated device located at least partially in the substrate, wherein the first integrated device includes at least one transistor, wherein the first integrated device includes a front side and a back side, wherein the first integrated device is coupled to the first plurality of interconnects through a first plurality of solder interconnects, wherein the same dielectric layer from the at least one dielectric layer touches (i) the front side of the first integrated device, (ii) the back side of the first integrated device and (iii) a side surface of the first integrated device; and a second integrated device coupled to the first plurality of interconnects through a second plurality of solder interconnects, wherein the front side of the first integrated device faces in a direction towards the second integrated device, wherein a front side of the second integrated device faces in a direction towards the first integrated device.

16. The device of claim 15, wherein the back side of the first integrated device includes a die substrate.

17. The device of claim 15, wherein an electrical path between the first integrated device and the second integrated device includes (i) a solder interconnect from the first plurality of solder interconnects, (ii) an interconnect from the first plurality of interconnects, and (iii) a solder interconnect from the second plurality of solder interconnects, and wherein the same dielectric layer from the at least one dielectric layer touches (i) the front side of the first integrated device, (ii) the back side of the first integrated device, (iii) a side surface of the first integrated device, (iv) the solder interconnect from the first plurality of solder interconnects, (v) the interconnect from the first plurality of interconnects and (vi) the solder interconnect from the second plurality of solder interconnects.

18. The device of claim 15, further comprising an underfill located between the second integrated device and the substrate.

19. The device of claim 15, further comprising:

a first underfill located laterally around the first plurality of interconnects and the first plurality of solder interconnects; and a second underfill located between the second integrated device and the substrate, wherein the second underfill is touching the first underfill.

20. The device of claim 19, wherein the first underfill includes a different material from the at least one dielectric layer.

21. The device of claim 15, wherein the at least one dielectric layer includes a first dielectric layer, a second dielectric layer and a third dielectric layer.

22. The device of claim 21, wherein the plurality of interconnects includes a via that extends through the first dielectric layer and the second dielectric layer.

23. The device of claim 21, wherein the first dielectric layer is coupled to a back side surface of the first integrated device and a side surface of the first integrated device.

24. The device of claim 15, wherein the second integrated device comprises a second front side and a second back side, wherein the front side of the first integrated device faces a first direction, and wherein the second front side of the second integrated device faces a second direction that is opposite to the first direction.

* * * * *